United States Patent [19]

Sorori et al.

[11] Patent Number: 5,609,992
[45] Date of Patent: Mar. 11, 1997

[54] PHOTOPOLYMERIZABLE COMPOSITION

[75] Inventors: Tadahiro Sorori; Yasuo Okamoto; Syunichi Kondo; Hiromichi Kurita, all of Shizuoka, Japan

[73] Assignee: Fuji Photo Film Co., Ltd., Ashigara, Japan

[21] Appl. No.: 549,227

[22] Filed: Oct. 27, 1995

[30] Foreign Application Priority Data

Nov. 1, 1994 [JP] Japan ..................... 6-269047
Feb. 10, 1995 [JP] Japan ..................... 7-023085

[51] Int. Cl.$^6$ ..................... G03F 7/031
[52] U.S. Cl. ............. 430/281.1; 430/926; 430/916; 430/920; 430/921; 430/923; 430/925; 522/16; 522/31; 522/50; 522/60; 522/63
[58] Field of Search ................. 430/926, 916, 430/920, 921, 923, 925, 281.1; 522/16, 31, 50, 60, 63

[56] References Cited

U.S. PATENT DOCUMENTS

| | | | |
|---|---|---|---|
| 2,610,120 | 9/1952 | Minsk et al. ................. | 95/7 |
| 3,175,905 | 3/1965 | Stahlhofer ................. | 96/33 |
| 3,563,749 | 2/1971 | Munder et al. ................. | 96/90 |
| 5,049,481 | 9/1991 | Okamoto et al. ................. | 430/926 X |

FOREIGN PATENT DOCUMENTS 2-244050  9/1990  Japan .

*Primary Examiner*—Cynthia Hamilton
*Attorney, Agent, or Firm*—Burns, Doane, Swecker & Mathis, LLP

[57] ABSTRACT

A photopolymerizable composition is disclosed, comprising (i) a compound having at least one addition-polymerizable, ethylenically unsaturated bond; (ii) a compound represented by formula (IA) or (IB):

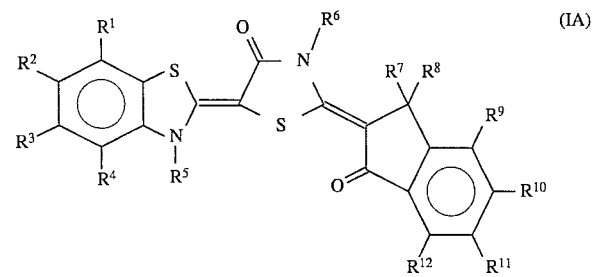

(IA)

wherein $R^1$, $R^2$, $R^3$, $R^4$, $R^9$, $R^{10}$, $R^{11}$ and $R^{12}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group or $R^1$ and $R^2$, $R^2$ and $R^3$, $R^3$ and $R^4$, $R^9$ and $R^{10}$, $R^{10}$ and $R^{11}$ or $R^{11}$ and $R^{12}$ may be combined with each other to form an aliphatic or aromatic ring; $R^5$ represents a hydrogen atom, an alkyl group, a substituted alkyl group, an aryl group or a substituted aryl group; $R^6$ represents a substituted or unsubstituted alkenylalkyl group, a substituted or unsubstituted alkynylalkyl group, a substituted or unsubstituted alkenyl group or a substituted or unsubstituted alkynyl group; and $R^7$ and $R^8$ each independently represents a hydrogen atom, a halogen atom, an alkyl group, a substituted alkyl group, an aryl group, a substituted aryl group or a substituted carbonyl group,

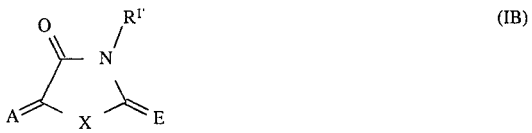

(IB)

wherein $A=$ represents a substituted or unsubstituted 2(1H)-pyridylidene group or a substituted or unsubstituted 4(1H)-pyridylidene group; —X— represents —O—, —S—, —NR$^{2'}$— or —CONR$^{3'}$—; $R^{1'}$, $R^{2'}$ and $R^{3'}$ each independently represents a hydrogen atom, an alkyl group, a substituted alkyl group, an aryl group, a substituted aryl group, an alkenyl group, a substituted alkenyl group, an alkynyl group or a substituted alkynyl group; and =E represents a substituted or unsubstituted 1,3-dihydro-1-oxo-2H-indene-2-ylidene; and (iii) a compound which generates an active radical upon light irradiation when in the presence of component (ii).

13 Claims, No Drawings

PHOTOPOLYMERIZABLE COMPOSITION

FIELD OF THE INVENTION

The present invention relates to a photopolymerizable composition, more specifically, it relates to a photopolymerizable composition comprising a photopolymerization initiation system using a novel composition capable of exhibiting excellent light sensitivity to visible light.

BACKGROUND OF THE INVENTION

The photopolymerizable composition is a material which undergoes changes in the physical properties of the composition upon polymerization induced by light irradiation and is widely used in the fields of printing, printed circuit, fine processing such as ultra LSI, painting, ink, hologram recording and three dimensional molding, thus the application of the composition is more and more expanding. The photopolymerizable composition fundamentally comprises an addition-polymerizable, ethylenically unsaturated compound and a photopolymerization initiator. Since this kind of composition undergoes polymerization upon light irradiation and thereby is cured and insolubilized, a photosensitive composition is prepared by adding a binder resin having a film-forming ability and a heat polymerization inhibitor, if desired, to the photopolymerizable composition to form an appropriate coating and subjected to light irradiation through a desired negative image and only the non-irradiated area is removed by a proper solvent (hereinafter referred simply as "development") to form an objective cured image. Such an image formation method is well known very useful in preparing a printing plate.

The photopolymerization initiator used in the polymerizable composition is conventionally benzyl, benzoin ether, Michler's ketone, anthraquinone, acridine, phenazine or benzophenone. However, the composition comprising such a photopolymerization initiator is low in the sensitization rate and extremely poor in the photopolymerization ability to visible light at 400 nm or more as compared with the photopolymerization ability to the light in an ultraviolet wavelength region of less than 400 nm. Accordingly, the photopolymerizable composition comprising a conventional photopolymerization initiator is strictly limited on the application range thereof.

A photosensitive composition able to be highly cured by a small amount of light irradiation has been long demanded. Such a photosensitive composition is useful as a photosensitive material suitable, for example, for the projection exposure of non-contact type. Further, in recent years, the image information technique using a visible laser has come into a practical use and accordingly, a photosensitive composition having a high photopolymerization ability to visible light has been keenly demanded. The visible laser light which is very expected to be use in such a method is an $Ar^+$ laser light having a wavelength at 488 nm, YAG—SHG laser light having a wavelength at 532 nm, or He—Ne laser light having a wavelength at 543 nm.

With respect to the photopolymerizable composition comprising a photopolymerization initiation system sensitive to visible light, several proposals have been offered. For example, U.S. Pat. No. 2,850,445 has reported that certain kinds of photosensitive dyes such as Rose Bengale, Eosine and erythrosine exhibit effective sensitivity to visible light. Also, in improved techniques, a composite initiation system of a dye and an amine (see, JP-B-44-20189 (the term "JP-B" as used herein means an "examined Japanese patent publication")), a system of a hexaarylbiimidazole, a radical generating agent and a dye (see JP-B-45-37377), a system of hexaarylbiimidazole and p-dialkylaminobenzylidene ketone (see, JP-B-47-2528 and JP-A-54-155292 (the term "JP-A" as used herein means an "unexamined published Japanese patent application")), a system of a 3-ketocoumarin compound and an active halogen compound (JP-A-58-15503) and a system of a substituted triazine and a merocyanine dye (see JP-A-54-15102) have been proposed. These techniques are effective to visible light but in practical viewpoint, the sensitivity achieved is still insufficient. JP-A-2-244050 proposes a system comprising a dye having a 4-thiazolidinone skeleton and a radical generating agent as a highly sensitive initiation system. This system is highly sensitive, however, the maximum photosensitivity is in the wavelength region of less than 500 nm and thus the photosensitivity is not sufficient to light at 500 mm or more.

SUMMARY OF THE INVENTION

An object of the present invention is to provide a highly-sensitive photopolymerizable composition, more specifically, a photopolymerizable composition comprising a photopolymerization initiator capable of increasing the photopolymerization rate of a photopolymerization composition containing an addition-polymerizable, ethylenically unsaturated compound.

Another object of the present invention is to provide a photopolymerizable composition containing a photopolymerization initiator having high sensitivity to visible light at 400 nm or more, particularly to light at around 488 nm corresponding to the outputs of an $Ar^+$ laser or at 500 nm or longer wavelength corresponding to the outputs of a YAG—SHG laser and a He—Ne laser, respectively.

Still another object of the present invention is to provide a photopolymerizable composition capable of providing a photosensitive material having excellent storage stability.

As a result of intensive investigations to achieve the above-described objects, the present inventors have found that a photopolymerizable composition containing a specific photopolymerization initiation system shows a very high photopolymerization rate and high sensitivity even to visible light at 400 nm or more, particularly at 500 nm or more and the present invention has been accomplished based on this finding.

The present invention provides a photopolymerizable composition comprising the following components (i), (ii) and (iii):

(i) a compound having at least one addition-polymerizable, ethylenically unsaturated bond;

(ii) a compound represented by formula (IA) or (IB):

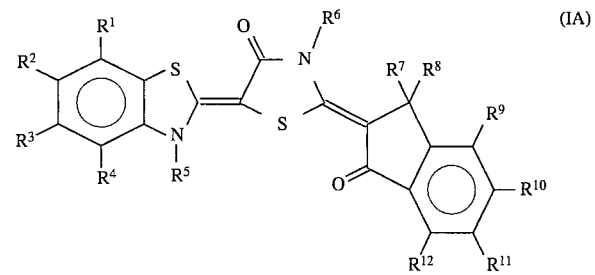

wherein $R^1$, $R^2$, $R^3$, $R^4$, $R^9$, $R^{10}$, $R^{11}$ and $R^{12}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group or $R^1$ and $R^2$, $R^2$ and $R^3$, $R^3$ and $R^4$, $R^9$ and $R^{10}$, $R^{10}$ and $R^{11}$ or $R^{11}$ and $R^{12}$ may be combined with each other to form an aliphatic or aromatic ring; $R^5$ represents a hydrogen atom, an alkyl group, a substituted alkyl group, an aryl group or a substituted aryl group; $R^6$ represents a substituted or unsubstituted alkenylalkyl group, a substituted or unsubstituted alkynylalkyl group, a substituted or unsubstituted alkenyl group or a substituted or unsubstituted alkynyl group; and $R^7$ and $R^8$ each independently represents a hydrogen atom, a halogen atom, an alkyl group, a substituted alkyl group, an aryl group, a substituted aryl group or a substituted carbonyl group,

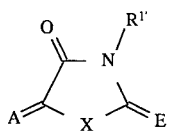  (IB)

wherein A= represents a substituted or unsubstituted 2(1H)-pyridylidene group or a substituted or unsubstituted 4(1H)-pyridylidene group; —X— represents —O—, —S—, —NR$^{2'}$— or —CONR$^{3'}$—; R$^{1'}$, R$^{2'}$ and R$^{3'}$ each independently represents a hydrogen atom, an alkyl group, a substituted alkyl group, an aryl group, a substituted aryl group, an alkenyl group, a substituted alkenyl group, an alkynyl group or a substituted alkynyl group; and =E represents a substituted or unsubstituted 1,3-dihydro-1-oxo-2H-indene-2-ylidene; and (iii) a compound which generates an active radical upon light irradiation when component (ii) is present together.

Each component of the photopolymerizable composition of the present invention will be described below in detail.

The compound having at least one addition-polymerizable, ethylenically unsaturated bond as component (i) used in the present invention is selected from the compounds having at least one, preferably two or more ethylenically unsaturated terminal bonds.

The compound is in the chemical form of such as a monomer, a prepolymer, more specifically, a dimer, a trimer or an oligomer, a mixture of these or a copolymer of these. Examples of the monomer and the copolymer thereof include esters of an unsaturated carboxylic acid (e.g., acrylic acid, methacrylic acid, itaconic acid, crotonic acid, isocrotonic acid, maleic acid) with an aliphatic polyhydric alcohol compound and amides of an unsaturated carboxylic acid with an aliphatic polyhydric amine compound.

With respect to the monomer of an ester of an aliphatic polyhydric alcohol compound with an unsaturated carboxylic acid, specific examples of the acrylic ester include ethylene glycol diacrylate, triethylene glycol diacrylate, 1,3-butanediol diacrylate, tetramethylene glycol diacrylate, propylene glycol diacrylate, neopentyl glycol diacrylate, tri-methylolpropane triacrylate, tri-methylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer.

Specific examples of the methacrylic ester include tetramethylene glycol dimethacrylate, triethylene glycol dimethacrylate, neopentyl glycol dimethacrylate, tri-methylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Specific examples of the itaconic ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Specific examples of the crotonic ester include ethylene glycol dicrotonate, tetramethylene glycol dicrotonate, pentaerythritol dicrotonate and sorbitol tetradicrotonate.

Specific examples of the isocrotonic ester include ethylene glycol diisocrotonate, pentaerythritol diisocrotonate and sorbitol tetraisocrotonate.

Specific examples of the maleic ester include ethylene glycol dimaleate, triethylene glycol dimaleate, pentaerythritol dimaleate and sorbitol tetramaleate.

A mixture of the above-described ester monomers may also be used.

Specific examples of the monomer of an amide of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include a vinyl urethane compound containing two or more polymerizable vinyl groups in one molecule resulting from the addition of a vinyl monomer containing a hydroxyl group represented by formula (D) to a polyisocyanate compound having two or more isocyanate groups in one molecule described in JP-B-48-41708:

CH$_2$=C(R)COOCH$_2$CH(R')OH   (D)

wherein R and R' each represents H or CH$_3$.

Also, a polyfunctional acrylate or methacrylate such as urethane acrylates described in JP-A-51-37193, polyester acrylates described in JP-A-48-64183, JP-B-49-43191 and JP-B-52-30490 and epoxy acrylates resulting from the reaction of an epoxy resin with a (meth)acrylic acid may be used. Further, those described as a photocurable monomer or oligomer in Nippon Secchaku Kyokaishi, Vol. 1, 20, No. 7, pp. 300–308 (1984) may be used. The above-described monomer or prepolymer is used in an amount of from 5 to 70% by weight (hereinafter referred to simply as "%"), preferably from 5 to 55% by weight, more preferably from 10 to 55% by weight, most preferably from 10 to 40% by weight, based on the total weight of the components.

The component (ii) for use in the present invention is a compound represented by formula (IA) or (IB) above.

The group represented by $R^1$, $R^2$, $R^3$ or $R^4$ in formula (IA) will be described below.

The alkyl group includes linear, branched and cyclic alkyl groups each having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferred a linear alkyl group having from 1 to 12 carbon atoms, a branched alkyl group having from 3 to 12 carbon atoms and a cyclic alkyl group having from 5 to 10 carbon atoms.

As the substituent for the substituted alkyl group, a monovalent nonmetallic atom group excluding hydrogen is used and preferred examples thereof include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkylalkoxycarbonylamino group, an N-alkylaryloxycarbonylamino group, an N-arylalkoxycarbonylamino group, an N-arylaryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugated base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkyl sulfamoyl group, an N-arylsulfamoyl group, an N,N-diarylsulfamoyl group, an N-alkylarylsulfamoyl group, a phosphono group (—PO$_3$H$_2$) and a conjugated base group thereof (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugated base group thereof (hereinafter referred to as an "alkyl phosphonato group"), a monoarylphosphono group (—PO$_3$H(aryl)) and a conjugated base group thereof (hereinafter referred to as an "aryl phosphonato group"), a phosphonooxy group (—OPO$_3$H$_2$) and a conjugated base group thereof (hereinafter referred to as an "phosphonato oxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugated-base group thereof (hereinafter referred to as an "alkyl phosphonato oxy group"), a monoarylphosphonooxy group (—OPO$_3$H(aryl)) and a conjugated base group thereof (hereinafter referred to as an "aryl phosphonato oxy group"), a cyano group, a nitro group, an aryl group and an alkenyl group. Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonato phenyl group. Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butenyl group and a trimethylsilylethynyl group. Examples of the group represented by $R^{13}$ in the acyl group ($R^{13}$CO—) include hydrogen and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arycarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkyl phosphonato group, a monoarylphosphono group, an aryl phosphonato group, a phosphonooxy group, a phosphonato oxy group, an aryl group and an alkenyl group. Examples of the alkylene group in the substituted alkyl group include a divalent organic residue resulting from removal of any one of hydrogen atoms on the above-described alkyl group having from 1 to 20 carbon atoms, preferably a linear alkylene group having from 1 to 12 carbon atoms, a branched alkylene group having from 3 to 12 carbon atoms and a cyclic alkylene group having from 5 to 10 carbon atoms. Preferred specific examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, N-methyl-N-(sulfophenyl)carbamoylmethyl group, a sulfobutyl group, a sulfonato butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyl group, an octyl group, a phosphonobutyl group, a phosphonato hexyl group, a diethylphosphonobutyl group, a diphenylphosphonopropyl group, a methylphosphonobutyl group, a methyl phosphonato butyl group, a tolylphosphonohexyl group, a tolyl phosphonato hexyl group, a phosphonooxypropyl group, a phosphonato oxybutyl group, a benzyl group, a phenetyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group includes a condensed ring formed by from 1 to 3 benzene rings and a condensed ring formed by a benzene ring and a 5-membered unsaturated ring and specific examples thereof include a phenyl group, a naphthyl group, an anthryl group, a phenanthryl group, an indenyl group, an acenaphthenyl group and a fluorenyl group, with a phenyl group and a naphthyl group being preferred.

The substituted aryl group includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonato phenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonato phenyl group, a diethylphosphonophenyl group, a diphenylphosphonophenyl group, a methylphosphonophenyl group, a methylphosphonato phenyl group, a tolylphosphonophenyl group, a tolylphosphonato phenyl group, an allyl group, a 1-propenylmethyl group, a 2-butenyl group, a 2-methylallylphenyl group, a 2-methylpropenylphenyl group, a 2-propenylphenyl group, a 3-butylphenyl group and a 3-butylphenyl group.

The substituted oxy group ($R^{14}O-$) includes those where $R^{14}$ is a monovalent nonmetallic atom group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonato oxy group. The alkyl group or the aryl group in the these groups includes those described above for the alkyl group and the substituted alkyl group or those described above for the aryl group and the substituted aryl group, respectively. The acyl group ($R^{15}CO-$) in the acyloxy group include those where $R^{15}$ is the above-described alkyl group, substituted alkyl group, aryl group or substituted aryl group. Among these, more preferred are an alkoxy group, an aryloxy group, an acyloxy group and an arylsulfoxy group. Preferred specific examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenetyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonato oxy group.

The substituted thio group ($R^{16}S-$) includes those where $R^{16}$ is a monovalent nonmetallic atom group exclusive of hydrogen. Preferred examples of the substituted thio group include an alkylthio group, an arylthio group, an alkyldithio group, an aryldithio group and an acylthio group. The alkyl group or the aryl group in these groups includes those described above for the alkyl group and the substituted alkyl group or those described above for the aryl group and the substituted aryl group, respectively. $R^{15}$ of the acyl group ($R^{15}CO-$) in the acylthio group has the same meaning as defined above. Among these, an alkylthio group and an arylthio group are more preferred. Preferred specific examples of the substituted thio group include a methylthio group, an ethylthio group, a phenylthio group, an ethoxyethylthio group, a carboxyethylthio group and a methoxycarbonylthio group.

The substituted amino group ($R^{17}NH-$, $(R^{18})(R^{19})N-$) include those where $R^{17}$, $R^{18}$ and $R^{19}$ each is a monovalent nonmetallic atom group exclusive of hydrogen. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl- N'-aryl-N-alkylureido group, an N'-alkyl-N'-aryl-N-arylureido group, an alkoxycarbonylamino group, an aryloxycarbonylamino group, an N-alkylalkoxycarbonylamino group, an N-alkylaryloxycarbonylamino group, an N-arylalkoxycarbonylamino group and an N-arylaryloxycarbonylamino group. The alkyl group or the aryl group in these groups includes those described above for the alkyl group and the substituted alkyl group or those described above for the aryl group and the substituted aryl group, respectively, and $R^{15}$ of the acyl group ($R^{15}CO—$) in the acylamino group, the N-alkylacylamino group or the N-arylacylamino group has the same meaning as defined above. Among these groups, more preferred are an N-alkylamino group, an N,N-dialkylamino group, an N-arylamino group and an acylamino group. Preferred specific examples of the substituted amino group include a methylamino group, an ethylamino group, a diethylamino group, a morpholino group, a piperidino group, a pyrrolidino group, a phenylamino group, a benzoylamino group and an acetylamino group.

The substituted carbonyl group ($R^{20}—CO—$) includes those where $R^{20}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group or the aryl group in these groups includes those described above for the alkyl group and the substituted alkyl group or those described above for the aryl group and the substituted aryl group, respectively. The substituent is more preferably a formyl group, an acyl group, a carboxyl group, an alkoxycarbonyl group, an aryloxycarbonyl group, a carbamoyl group, an N-alkylcarbamoyl group, an N,N-dialkylcarbamoyl group or an N-arylcarbamoyl group, still more preferably a formyl group, an acyl group, a carboxyl group, an alkoxycarbonyl group or an aryloxycarbonyl group. Specific examples of preferred substituents include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

The substituted sulfinyl group ($R^{21}—SO—$) includes those where $R^{21}$ is a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group or the aryl group in these groups includes those described above for the alkyl group and the substituted alkyl group or those described above for the aryl group and the substituted aryl group, respectively. Among these, more preferred are an alkylsulfinyl group and an arylsulfinyl group. Specific examples of the substituted sulfinyl group include a hexylsulfinyl group, a benzylsulfinyl group and tolylsulfinyl group.

The substituted sulfonyl group ($R^{22}—SO_2—$) include those where $R^{22}$ is a monovalent nonmetallic atom group. More preferred examples thereof include an alkylsulfonyl group and an arylsulfonyl group. The alkyl group or the aryl group in these groups includes those described above for the alkyl group and the substituted alkyl group or those described above for the aryl group and the substituted aryl group, respectively. Specific examples of the substituted sulfonyl group include a butylsulfonyl group and a chlorophenylsulfonyl group.

The sulfonato group ($—SO_3^-$) means a conjugated base anion group of a sulfo group ($—SO_3H$) as described above and it is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group means a compound resulting from substitution of one or two hydroxyl groups on the phosphono group by other organic oxo groups and preferred examples thereof include a dialkylphosphono group, a diarylphosphono group, an alkylarylphosphono group, a monoalkylphosphono group and a monoarylphosphono group. Among these, preferred are a dialkylphosphono group and a diarylphosphono group. Specific examples thereof include a diethylphosphono group, a dibutylphosphono group and a diphenylphosphono group The phosphonato group ($—PO_3^{2-}$, $—PO_3H^-$) means a conjugated base anion group derived from acid first dissociation or acid second dissociation of a phosphono group ($—PO_3H_2$). It is usually used preferably in combination with a counter cation. The counter cation includes commonly known cations, more specifically, various oniums (e.g., ammoniums, sulfoniums, phosphoniums, iodoniums, aziniums) and metal ions (e g , $Na^+$, $K^+$, $Ca^{2+}$, $Zn^{2+}$).

The substituted phosphonato group is a conjugated base anion group of a substituted phosphono group where one hydroxyl group is substituted by an organic oxo group, among the above-described substituted phosphono groups. Specific examples thereof include a conjugated base group of a monoalkylphosphono group ($—PO_3H(alkyl)$) and a conjugated base group of a monoarylphosphono group ($—PO_3H(aryl)$). The substituted phosphonato group is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

Among the groups described above for $R^1$, $R^2$, $R^3$ and $R^4$, more preferred are a hydrogen atom, a halogen atom (—F, —Cl, —Br, —I), an alkyl group, a substituted alkyl group, an aryl group, a hydroxyl group (—OH), a substituted thio group, a substituted amino group, a substituted carbonyl group, a sulfo group, a sulfonato group, a cyano group and a nitro group, and more preferred are a substituted alkyl group with the substituent being a halogen or $—OR^{51}$ (wherein $R^{51}$ is alkyl, substituted alkyl, aryl or substituted aryl of which examples are described above).

The ring formed by combining $R^1$ and $R^2$, $R^2$ and $R^3$ or $R^3$ and $R^4$ with each other will be described below. The aliphatic ring formed by combining $R^1$ and $R^2$, $R^2$ and $R^3$ or $R^3$ and $R^4$ with each other is a 5-, 6-, 7- or 8-membered aliphatic ring, more preferably a 5- or 6-membered aliphatic ring. The aliphatic ring may have a substituent on the carbon atoms constituting the ring (examples of the substituent include those described above as examples of the alkyl group and of the substituent on the substituted alkyl group) or a part of the ring-constituting carbons may be substituted by a hetero atom (e.g., oxygen atom, sulfur atom, nitrogen atom). Preferred specific examples thereof include those capable of forming a benzocyclopentene ring, a benzocyclohexene ring, a benzocycloheptene ring, a benzocyclooctene ring, a 1,3-benzocyclohexadiene ring, a 1,3-dihydro-1,3-dioxaindene ring or a julolidine ring in cooperation with the benzene ring containing the carbon atom to which the above-described substituent or hetero atom is bonded in formula (IA).

Examples of the aromatic ring formed by combining $R^1$ and $R^2$, $R^2$ and $R^3$ or $R^3$ and $R^4$ with each other include a naphthalene ring and an anthracene ring formed in cooperation with the benzene ring containing the carbon atom to which each group is bonded, with the naphthalene ring being more preferred. The aromatic ring may have a substituent on the carbon atoms constituting the ring (examples of the substituent include those described above as examples of the alkyl group and of the substituent on the substituted alkyl group).

More preferred examples of the group represented by $R^1$, $R^2$, $R^3$ or $R^4$ in formula (IA) will be specifically described below.

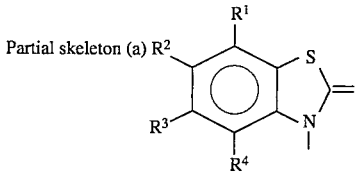

| | $R^1$ | $R^2$ | $R^3$ | $R^4$ |
|---|---|---|---|---|
| (a-1) | —H | —H | —H | —H |
| (a-2) | —CH₃ | —H | —H | —H |
| (a-3) | —H | —CH₃ | —H | —H |
| (a-4) | —H | —H | —CH₃ | —H |
| (a-5) | —H | —H | —H | —CH₃ |
| (a-6) | —H | —CH₃ | —CH₃ | —H |
| (a-7) | —H | —ᵗBu | —H | —H |
| (a-8) | —H | —H | —ᵗBu | —H |
| (a-9) | —H | —CF₃ | —H | —H |
| (a-10) | —H | —H | —CF₃ | —H |
| (a-11) | —H | —H | —CH₂Cl | —H |
| (a-12) | —H | —H | —CH₂OH | —H |
| (a-13) | —Cl | —H | —H | —H |
| (a-14) | —H | —Cl | —H | —H |
| (a-15) | —H | —H | —Cl | —H |
| (a-16) | —H | —H | —H | —Cl |
| (a-17) | —H | —Cl | —Cl | —H |
| (a-18) | —H | —H | —Br | —H |
| (a-19) | —H | —I | —H | —H |
| (a-20) | —H | —H | —I | —H |
| (a-21) | —H | —H | —F | —H |
| (a-22) | —H | —CH₃ | —Cl | —H |
| (a-23) | —H | —H | —Ph | —H |
| (a-24) | —H | —OCH₃ | —H | —H |
| (a-25) | —H | —OC₆H₁₃ | —H | —H |
| (a-26) | —H | —H | —OCH₃ | —H |
| (a-27) | —H | —H | —OC₂H₅ | —H |
| (a-28) | —H | —H | —OC₃H₇ | —H |
| (a-29) | —H | —H | —OC₄H₉ | —H |
| (a-30) | —H | —H | —OC₅H₁₁ | —H |
| (a-31) | —H | —H | —OC₁₂H₂₅ | —H |
| (a-32) | —H | —H | —H | —OCH₃ |
| (a-33) | —CH₃ | —H | —H | —OCH₃ |
| (a-34) | —H | —CH₃ | —OCH₃ | —H |
| (a-35) | —H | —OCH₃ | —OCH₃ | —H |
| (a-36) | —H | —OC₂H₄CO₂H | —H | —H |
| (a-37) | —H | —H | —OC₂H₄CO₂H | —H |
| (a-38) | —H | —H | —OC₄H₈SO₃⁻ | —H |
| (a-39) | —H | —H | —OPh | —H |
| (a-40) | —H | —OH | —H | —H |
| (a-41) | —H | —H | —OH | —H |
| (a-42) | —H | —OH | —OH | —H |
| (a-43) | —H | —CH₃ | —OH | —H |
| (a-44) | —H | —SCH₃ | —H | —H |
| (a-45) | —H | —H | —SPh | —H |
| (a-46) | —H | —N(CH₃)₂ | —H | —H |
| (a-47) | —H | —N(C₂H₅)₂ | —H | —H |
| (a-48) | —H | —H | —COCH₃ | —H |
| (a-49) | —H | —H | —COC₂H₅ | —H |

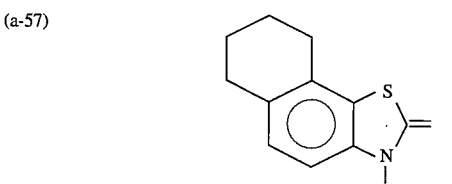

| | $R^1$ | $R^2$ | $R^3$ | $R^4$ |
|---|---|---|---|---|
| (a-50) | —H | —H | —CO₂H | —H |
| (a-51) | —H | —H | —CO₂CH₃ | —H |
| (a-52) | —H | —H | —CO₂C₂H₅ | —H |
| (a-53) | —H | —H | —CN | —H |
| (a-54) | —H | —NO₂ | —H | —H |
| (a-55) | —H | —H | —NO₂ | —H |
| (a-56) | —H | —NO₂ | —Cl | —H |

(a-57) 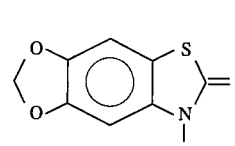

(a-58) 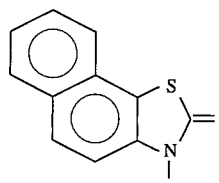

(a-59) 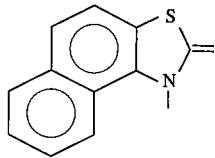

(a-60) 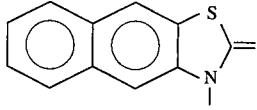

(a-61) 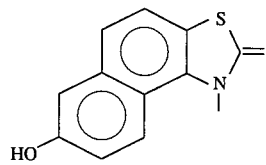

(a-62) 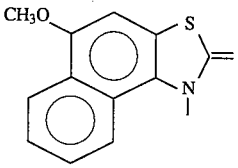

(a-63)

Partial skeleton (a)

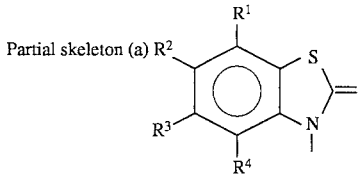

| | R¹ | R² | R³ | R⁴ |
|---|---|---|---|---|
| (a-64) | | | | |
| (a-65) | | | | |

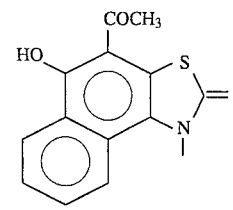

The group represented by $R^5$ in formula (IA) will be described below. The alkyl group, the substituted alkyl group, the aryl group and the substituted aryl group include those described above for $R^1$, $R^2$, $R^3$ and $R^4$. Preferred specific examples of the group represented by $R^5$ include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, an allyl group, a 1-propenylmethyl group, a 2-butenyl group, a 2-methylallyl group, a 2-methylpropenyl group, a 2-propenyl group, a 2-butynyl group, a 3-butynyl group, a benzyl group, a phenetyl group, an α-methylbenzyl group, a 1-methyl-1-phenetyl group, a p-methylbenzyl group, a cinnamyl group, a hydroxyethyl group, a methoxyethyl group, a phenoxyethyl group, an allyloxyethyl group, a methoxyethoxyethyl group, an ethoxyethoxyethyl group, a morpholinoethyl group, a morpholinopropyl group, a sulfopropyl group, a sulfonatopropyl group, a sulfobutyl group, a sulfonatobutyl group, a carboxymethyl group, a carboxyethyl group, a carboxypropyl group, a methoxycarbonylethyl group, a 2-ethylhexyloxycarbonylethyl group, a phenoxycarbonylmethyl group, a methoxycarbonylpropyl group, an N-methylcarbamoylethyl group, an N,N-ethylaminocarbamoylmethyl group, an N-phenylcarbamoylpropyl group, an N-tolylsulfamoylbutyl group, a p-trienesulfonylaminopropyl group, a benzoylaminohexyl group, a phosphonomethyl group, a phosphonoethyl group, a phosphonopropyl group, a p-phosphonobenzylaminocarbonylethyl group, a phosphonato methyl group, a phosphonato propyl group, a phosphonato butyl group and a p-phosphonato benzylaminocarbonylethyl group.

The group represented by $R^6$ in formula (IA) will be described below. $R^6$ is a substituted or unsubstituted alkenylalkyl, alkynylalkyl, alkenyl or alkynyl group represented by the formula: $-R^{23}-C(R^{24})=C(R^{25})(R^{26})$ or $-R^{27}-C \equiv C-R^{28}$, wherein $R^{23}$ and $R^{27}$ each represents a covalent bond or a linear, branched or cyclic alkylene group having from 1 to 20 carbon atoms, more preferably a covalent bond, a linear alkylene group having from 1 to 6 carbon atoms, a branched alkylene group having from 2 to 8 carbon atoms or a cyclic alkylene group having from 5 to 10 carbon atoms; and $R^{24}$, $R^{25}$, $R^{26}$ and $R^{28}$ each represents a hydrogen atom, a halogen atom, an alkyl group, a substituted alkyl group, an aryl group or a substituted aryl group (examples of these groups include those described above for $R^1$, $R^2$, $R^3$ and $R^4$). The substituent $R^{24}$, $R^{25}$, $R^{26}$ or $R^{28}$ is more preferably a hydrogen atom, a halogen atom or a linear, branched or cyclic alkyl group having from 1 to 10 carbon atoms. Specific examples of the group represented by $R^6$ include an allyl group, a 2-butenyl group, a 3-butenyl group, a 2-pentenyl group, a 3-pentenyl group, a 4-pentenyl group, a 5-hexenyl group, a 2-octenyl group, a 7-octenyl group, a 1-methylpropenyl group, a 1,1-dimethylpropenyl group, a 2-methylpropenyl group, a 2-ethylpropenyl group, a 3,3-dimethylpropenyl group, a 2-cyclohexenyl group, a geranyl group (e.g., 7,7,3,3-tetramethyl-2,6-heptadienyl), a citronenyl group (e.g., 7,7,3-trimethyl-5-heptenyl), a 2-chloro-2-propenyl group, a 3-chloro-2-propenyl group, a 2-propynyl group, a 2-butynyl group, a 3-butynyl group, a 4-pentynyl group, a 1,1-dimethylpropynyl group, a 1,1-diethylpropynyl group, a 4,4-dimethyl-2-butynyl group, a vinyl group, a chloroethynyl group, a 1-propenyl group, a 1-butenyl group, a styryl group, an ethynyl group and a 2-phenylethynyl group. $R^6$ is most preferably an allyl group, a 2-propynyl group, a vinyl group or an ethynyl group.

The group represented by $R^7$ or $R^8$ in formula (IA) will be described below. The alkyl group, the substituted alkyl group, the aryl group and the substituted aryl group include those described above for $R^1$, $R^2$, $R^3$ and $R^4$.

The group represented by $R^9$, $R^{10}$, $R^{11}$ or $R^{12}$ in formula (IA) will be described below. The substituent $R^9$, $R^{10}$, $R^{11}$ or $R^{12}$ suitably includes those described above for $R^1$, $R^2$, $R^3$ and $R^4$. Also, when $R^9$ and $R^{10}$, $R^{10}$ and $R^{11}$ or $R^{11}$ and $R^{12}$ are combined together to form a ring, examples of the ring include those described above for $R^1$, $R^2$, $R^3$ and $R^4$.

More preferred examples of the group represented by $R^7$, $R^8$, $R^9$, $R^{10}$, $R^{11}$ or $R^{12}$ in formula (IA) are specifically described below.

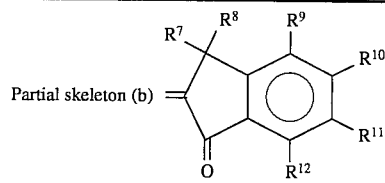

Partial skeleton (b) =

| | $R^7$ | $R^8$ | $R^9$ | $R^{10}$ | $R^{11}$ | $R^{12}$ |
|---|---|---|---|---|---|---|
| (b-1) | —H | —H | —H | —H | —H | —H |
| (b-2) | —CH₃ | —H | —H | —H | —H | —H |
| (b-3) | —CH₃ | —CH₃ | —H | —H | —H | —H |
| (b-4) | —Ph | —H | —H | —H | —H | —H |
| (b-5) | —C₆H₄Cl | —H | —H | —H | —H | —H |
| (b-6) | —C₆H₄OCH₃ | —H | —H | —H | —H | —H |
| (b-7) | —C₆H₄N(CH₃)₂ | —H | —H | —H | —H | —H |
| (b-8) | —Cl | —Cl | —H | —H | —H | —H |
| (b-9) | —C(CH₃)₃ | —H | —H | —H | —H | —H |
| (b-10) | —CH(CH₃)₂ | —H | —CH₃ | —H | —H | —H |
| (b-11) | —H | —H | —CH₃ | —H | —H | —H |
| (b-12) | —H | —H | —H | —CH₃ | —H | —H |
| (b-13) | —H | —H | —H | —H | —CH₃ | —H |
| (b-14) | —H | —H | —H | —H | —H | —CH₃ |
| (b-15) | —CH₃ | —H | —H | —H | —CH₃ | —H |
| (b-16) | —H | —H | —H | —H | —C(CH₃)₃ | —H |
| (b-17) | —H | —H | —CH₃ | —H | —CH(CH₃)₂ | —H |
| (b-18) | —H | —H | —CH(CH₃)₂ | —H | —H | —CH₃ |
| (b-19) | —CH₃ | —CH₃ | —H | —C₂H₅ | —H | —H |
| (b-20) | —CH₂Ph | —H | —H | —CH₃ | —H | —H |
| (b-21) | —H | —H | —H | —CH₃ | —CH₃ | —H |
| (b-22) | —H | —H | —CH₃ | —H | —H | —CH₃ |
| (b-23) | —Ph | —CH₃ | —H | —H | —H | —H |
| (b-24) | —CH₃ | —CH₃ | —H | —CH₃ | —CH₃ | —CH₃ |
| (b-25) | —CH₃ | —CH₃ | —CH₃ | —CH₃ | —H | —CH₃ |
| (b-26) | —CH₃ | —CH₃ | —CH₃ | —H | —H | —CH₃ |
| (b-27) | —H | —H | —H | —CH₃ | —H | —CH₃ |
| (b-28) | —H | —H | —CH₃ | —H | —H | —CH(CH₃)₂ |
| (b-29) | —H | —H | —Cl | —H | —H | —H |
| (b-30) | —H | —H | —H | —Cl | —H | —H |
| (b-31) | —H | —H | —H | —H | —Cl | —H |
| (b-32) | —CH₃ | —H | —H | —Cl | —H | —H |
| (b-33) | —H | —H | —Cl | —H | —H | —CH₃ |
| (b-34) | —H | —H | —CH₃ | —H | —H | —Cl |
| (b-35) | —H | —H | —Br | —H | —H | —H |
| (b-36) | —H | —H | —H | —Br | —H | —H |
| (b-37) | —H | —H | —H | —H | —I | —H |
| (b-38) | —H | —H | —CH(CH₃)₂ | —H | —H | —Br |
| (b-39) | —H | —H | —Br | —H | —H | —CH(CH₃)₂ |
| (b-40) | —H | —H | —CH₃ | —H | —H | —Br |
| (b-41) | —H | —H | —Br | —H | —H | —CH₃ |
| (b-42) | —H | —H | —OH | —H | —H | —H |
| (b-43) | —H | —H | —H | —OH | —H | —H |
| (b-44) | —H | —H | —OC₂H₅ | —H | —H | —H |
| (b-45) | —H | —H | —H | —OCH₃ | —H | —H |
| (b-46) | —H | —H | —H | —H | —OCH₃ | —H |
| (b-47) | —H | —H | —OCH₃ | —OCH₃ | —H | —H |
| (b-48) | —H | —H | —H | —OCH₃ | —OCH₃ | —H |
| (b-49) | —H | —H | —H | —OCH₃ | —H | —OCH₃ |
| (b-50) | —H | —H | —OCH₃ | —OCH₃ | —OCH₃ | —H |
| (b-51) | —H | —H | —H | —OCH₃ | —OCH₃ | —OCH₃ |
| (b-52) | —H | —H | —OH | —H | —H | —OH |
| (b-53) | —H | —H | —H | —N(CH₃)₂ | —H | —H |
| (b-54) | —H | —H | —H | —SCH₃ | —H | —H |
| (b-55) | —H | —H | —H | —OC₂H₅CO₂H | —H | —H |
| (b-56) | —H | —H | —H | —OC₂H₅CO₂CH₃ | —H | —H |

-continued
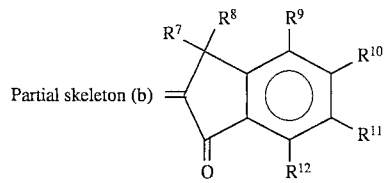
Partial skeleton (b)
| | R⁷ | R⁸ | R⁹ | R¹⁰ | R¹¹ | R¹² |
|---|---|---|---|---|---|---|
| (b-57) | —H | —H | —H | —H | —CO₂H | —H |
| (b-58) | —H | —H | —H | —H | —CO₂C₂H₅ | —H |
| (b-59) | —H | —H | —H | —Ph | —H | —H |
| (b-60) | —H | —H | —NO₂ | —H | —H | —H |
| (b-61) | —CH₃ | —CH₃ | —H | —H | —NO₂ | —H |
| (b-62) | —CO₂H | —H | —H | —H | —H | —H |
| (b-63) | —CH₂CO₂H | —H | —H | —H | —H | —H |
| (b-64) | —CO₂C₂H₅ | —H | —H | —H | —H | —H |
(b-65)
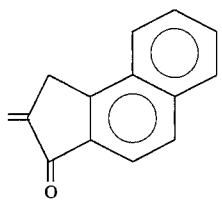
(b-66)
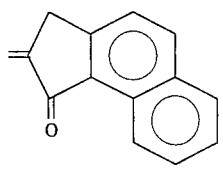
(b-67)
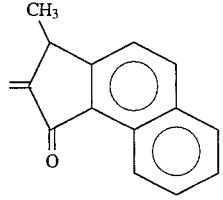
(b-68)
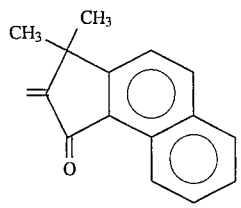
(b-69)
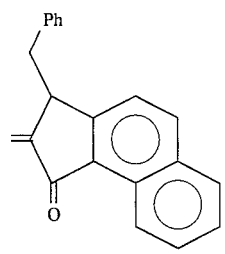
(b-70)
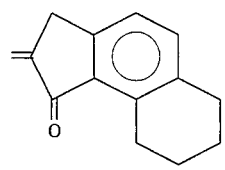

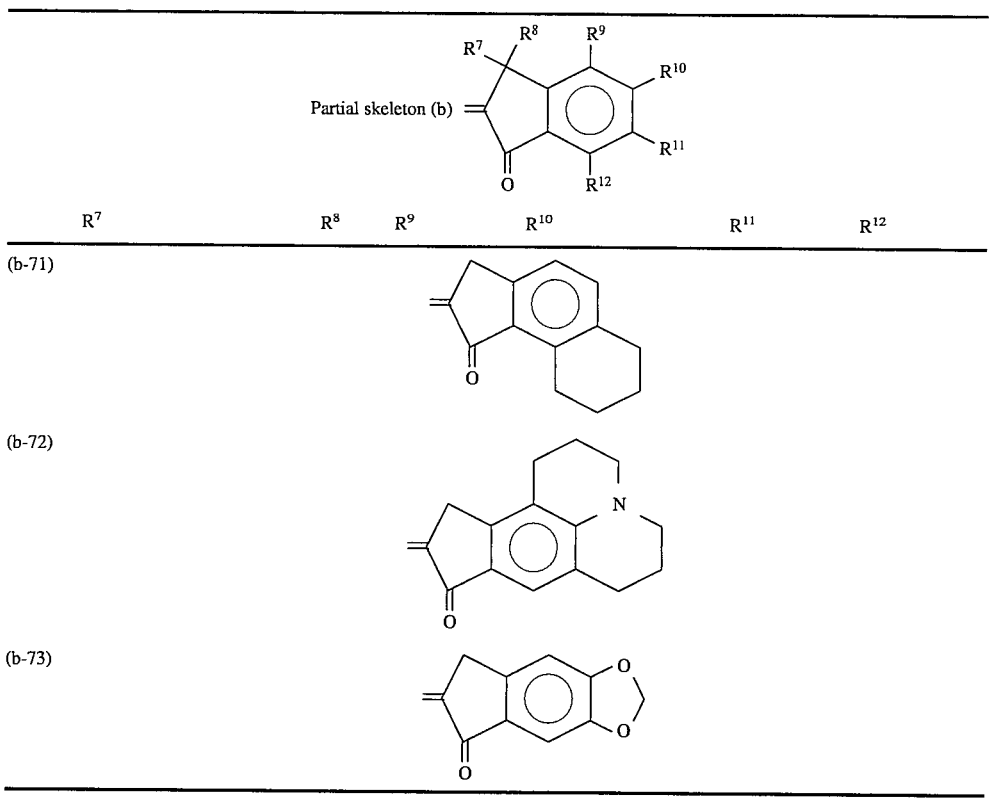
The compound represented by formula (IA) can be formed by combining in permutation the partial skeleton (a) including skeletons (a-1) to (a-65) with the partial skeleton (b) including skeletons (b-1) to (b-73).
Most preferred specific examples of the compound represented by formula (IA) are set forth below.

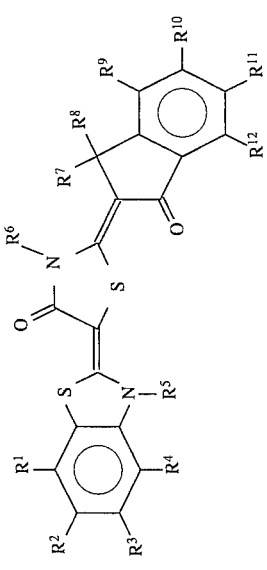

| | $R^1$ | $R^2$ | $R^3$ | $R^4$ | $R^5$ | $R^6$ | $R^7$ | $R^8$ | $R^9$ | $R^{10}$ | $R^{11}$ | $R^{12}$ |
|---|---|---|---|---|---|---|---|---|---|---|---|---|
| (IA-1) | —H | —H | —H | —H | —$C_4H_9$ | —$CH_2CH=CH_2$ | —H | —H | —H | —H | —H | —H |
| (IA-2) | —H | —H | —H | —H | —$C_5H_{11}$ | —$CH_2CH=CH_2$ | —H | —H | —H | —H | —H | —H |
| (IA-3) | —H | —H | —H | —H | —$C_6H_{13}$ | —$CH_2CH=CH_2$ | —H | —H | —H | —H | —H | —H |
| (IA-4) | —H | —H | —H | —H | —$C_7H_{15}$ | —$CH_2CH=CH_2$ | —H | —H | —H | —H | —H | —H |
| (IA-5) | —H | —H | —H | —H | —$C_8H_{17}$ | —$CH_2CH=CH_2$ | —H | —H | —H | —H | —H | —H |
| (IA-6) | —H | —H | —H | —H | —$C_{10}H_{21}$ | —$CH=CH_2$ | —H | —H | —H | —H | —H | —H |
| (IA-7) | —H | —H | —H | —H | —$C_6H_{13}$ | —$CH_2C≡CH$ | —H | —H | —H | —H | —H | —H |
| (IA-8) | —H | —$CH_3$ | —H | —H | —$C_6H_{13}$ | —C≡CH | —H | —H | —H | —H | —H | —H |
| (IA-9) | —H | —$CH_3$ | —H | —H | —$C_4H_{15}$ | —$CH_2CH=CH_2$ | —H | —H | —H | —H | —H | —H |
| (IA-10) | —H | —$CH_3$ | —H | —H | —$C_8H_{17}$ | —$CH_2CH=CH_2$ | —H | —H | —H | —H | —H | —H |
| (IA-11) | —H | —$CH_3$ | —$CH_3$ | —H | —$C_{10}H_{21}$ | —$CH_2CH=CH_2$ | —H | —H | —H | —H | —H | —H |
| (IA-12) | —H | —Cl | —H | —H | —$C_6H_{15}$ | —$CH_2CH=CH_2$ | —H | —H | —H | —H | —H | —H |
| (IA-13) | —H | —Cl | —Cl | —H | —$C_6H_{17}$ | —$CH_2CH=CH_2$ | —H | —H | —H | —H | —H | —H |
| (IA-14) | —H | —$OCH_3$ | —H | —H | —$C_6H_{15}$ | —$CH_2CH=CH_2$ | —H | —H | —H | —H | —H | —H |
| (IA-15) | —H | —H | —$OCH_3$ | —H | —$C_6H_{17}$ | —$CH_2CH=CH_2$ | —H | —H | —H | —H | —H | —H |
| (IA-16) | —H | —$OCH_3$ | —$OCH_3$ | —H | —$C_6H_{15}$ | —$CH_2CH=CH_2$ | —H | —H | —H | —H | —H | —H |
| (IA-17) | —H | —$OCH_3$ | —$OCH_3$ | —H | —$C_6H_{17}$ | —$CH_2CH=CH_2$ | —H | —H | —H | —H | —H | —H |
| (IA-18) | —H | —$N(CH_3)_2$ | —H | —H | —$C_8H_{17}$ | —$CH_2CH=CH_2$ | —H | —H | —H | —H | —H | —H |
| (IA-19) | —H | —H | —H | —H | —$C_7H_{15}$ | —$(CH_2)_7CH=CH_2$ | —H | —H | —H | —H | —H | —H |
| (IA-20) | —H | —H | —H | —H | —$C_7H_{15}$ | —$(CH_2)_7CH=CH_2$ | —H | —H | —H | —H | —H | —H |
| (IA-21) | —H | —H | —H | —H | —$C_7H_{15}$ | —$(CH_2)_7CH=CH_2$ | —H | —H | —H | —H | —H | —H |
| (IA-22) | —H | —H | —H | —H | —$C_7H_{15}$ | —$(CH_2)_7C≡CH$ | —H | —H | —H | —H | —H | —H |
| (IA-23) | —H | —H | —H | —H | —$C_5H_{15}$ | —$CH_2CH=CH_2$ | —$CH_3$ | —H | —H | —H | —H | —H |
| (IA-24) | —H | —H | —H | —H | —$C_5H_{15}$ | —$CH_2CH=CH_2$ | —$CH_3$ | —$CH_3$ | —H | —H | —H | —H |
| (IA-25) | —H | —H | —H | —H | —$C_5H_{15}$ | —$CH_2CH=CH_2$ | —Ph | —H | —H | —H | —H | —H |
| (IA-26) | —H | —H | —H | —H | —$C_5H_{15}$ | —$CH_2CH=CH_2$ | —H | —H | —H | —$OCH_3$ | —H | —H |
| (IA-27) | —H | —H | —H | —H | —$C_5H_{15}$ | —$CH_2CH=CH_2$ | —H | —H | —H | —H | —$OCH_3$ | —H |

-continued

| | R$^1$ | R$^2$ | R$^3$ | R$^4$ | R$^5$ | R$^6$ | R$^7$ | R$^8$ | R$^9$ | R$^{10}$ | R$^{11}$ | R$^{12}$ |
|---|---|---|---|---|---|---|---|---|---|---|---|---|
| (IA-28) | –H | –H | –H | –H | –C$_7$H$_{15}$ | –CH$_2$CH=CH$_2$ | –H | –H | –H | –OCH$_3$ | –OCH$_3$ | –H |
| (IA-29) | –H | –H | –H | –H | –C$_7$H$_{15}$ | –CH$_2$CH=CH$_2$ | –H | –H | –Br | –H | –H | –CH$_3$ |
| (IA-30) | –H | –H | –H | –H | –C$_7$H$_{15}$ | –CH$_2$CH=CH$_2$ | –H | –H | –CH$_3$ | –H | –H | –Br |
| (IA-31) | –H | –H | –H | –H | –CH$_2$CH$_2$OCH$_2$CH=CH$_2$ | –CH$_2$CH=CH$_2$ | –H | –H | –OCH$_3$ | –OCH$_3$ | –OCH$_3$ | –H |
| (IA-32) | –H | –H | –H | –H | –CH$_2$CH$_2$OCH$_2$CH$_2$OCH$_3$ | –CH$_2$CH=CH$_2$ | –H | –H | –H | –OCH$_3$ | –OCH$_3$ | –OCH$_3$ |
| (IA-33) | –H | –H | –H | –H | –(CH$_2$)$_4$–SO$_3^\ominus$ | –CH$_2$CH=CH$_2$ | –H | –H | –H | –H | –H | –H |
| (IA-34) | –H | –H | –H | –H | –CH$_2$CO$_2$H | –CH$_2$CH=CH$_2$ | –H | –H | –H | –H | –H | –H |
| (IA-35) | –H | –H | –H | –H | –CH$_2$CH$_2$CO$_2$H | –CH$_2$CH=CH$_2$ | –H | –H | –H | –H | –H | –H |
| (IA-36) | –H | –H | –H | –H | –(CH$_2$)$_3$–CO$_2$H | –CH$_2$CH=CH$_2$ | –H | –H | –H | –H | –H | –H |
| (IA-37) | –H | –H | –H | –H | –CH$_2$CO$_2$C$_6$H$_{13}$ | –CH$_2$CH=CH$_2$ | –H | –H | –H | –H | –H | –H |
| (IA-38) | –H | –H | –H | –H | –CH$_2$CH$_2$CO$_2$C$_2$H$_5$ | –CH$_2$CH=CH$_2$ | –H | –H | –H | –N(CH$_3$)$_2$ | –H | –H |
| (IA-39) | –H | –H | –H | –H | –C$_8$H$_{17}$ | –CH$_2$CH=CH$_2$ | –H | –H | –H | morpholino | –H | –H |
| (IA-40) | –H | –H | –H | –H | –C$_7$H$_{15}$ | –CH$_2$CH=CH$_2$ | –H | –H | –H | –H | –H | –H |
| (IA-41) | –H | –H | –H | –H | –C$_7$H$_{15}$ | –CH$_2$CH=CH$_2$ | –H | –H | –H | –F | –H | –H |
| (IA-42) | –H | | | | –C$_6$H$_{13}$ | –CH$_2$CH=CH$_2$ | | –H | –H | –H | –H | –H |
| (IA-43) | –H | | | | –C$_7$H$_{15}$ | –CH$_2$CH=CH$_2$ | | –H | –H | –H | –H | –H |
| (IA-44) | –H | | | | –C$_8$H$_{17}$ | –CH$_2$CH=CH$_2$ | | –H | –H | –H | –H | –H |
| (IA-45) | –H | | | | –C$_{10}$H$_{21}$ | –CH$_2$CH=CH$_2$ | | –H | –H | –H | –H | –H |

-continued
| R[1] | R[2] | R[3] | R[4] | R[5] | R[6] | R[7] | R[8] | R[9] | R[10] | R[11] | R[12] |
|---|---|---|---|---|---|---|---|---|---|---|---|
| (IA-46) | | | | | 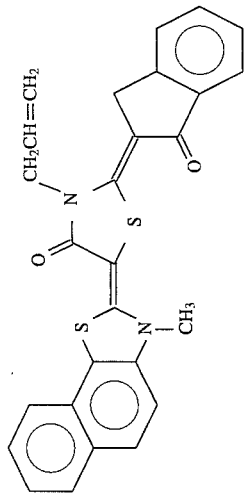 | | | | | | |

The 2(1H)-pyridylidene group or the 4(1H)-pyridylidene group as A= in formula (IB) is represented by the following partial structural formula (A-1) or (A-2), respectively:

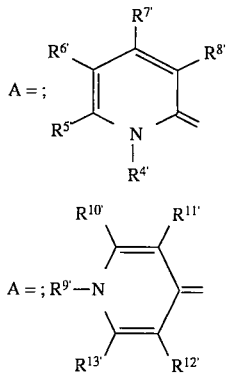

In formulae (A-1) and (A-2), $R^{4'}$, $R^{5'}$, $R^{6'}$, $R^{7'}$, $R^{8'}$, $R^{9'}$, $R^{10'}$, $R^{11'}$, $R^{12'}$ and $R^{13'}$ each independently represents a monovalent nonmetallic atom group and more preferably, $R^{4'}$ and $R^{9'}$ each independently represents a hydrogen atom, an alkyl group, a substituted alkyl group, an aryl group, a substituted aryl group, an alkenyl group, a substituted alkenyl group, an alkynyl group or a substituted alkynyl $R^{5'}$, $R^{6'}$, $R^{7'}$, $R^{8'}$, $R^{10'}$, $R^{11'}$, $R^{12'}$ and $R^{13'}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group and $R^{5'}$ and $R^{6'}$, $R^{6'}$ and $R^{7'}$, $R^{7'}$ and $R^{8'}$, $R^{10'}$ and $R^{11'}$ or $R^{12'}$ and $R^{13'}$ may be combined with each other to form a ring.

preferred examples of the group represented by $R^{4'}$ or $R^{9'}$ in partial structural formula (A-1) or (A-2) are described below in detail.

The alkyl group includes linear, branched and cyclic alkyl groups each having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferred a linear alkyl group having from 1 to 12 carbon atoms, a branched alkyl group having from 3 to 12 carbon atoms and a cyclic alkyl group having from 5 to 10 carbon atoms.

As the substituent for the substituted alkyl group, a monovalent nonmetallic atom group excluding hydrogen is used and preferred examples thereof include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N-alkyl-N'-aryl-N-arylureido group, an alkoxycarbonylamino group, an aryloxycarbonylamino group, an N-alkylalkoxycarbonylamino group, an N-alkylaryloxycarbonylamino group, an N-arylalkoxycarbonylamino group, an N-arylaryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugated base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkyl sulfamoyl group, an N-arylsulfamoyl group, an N,N-diarylsulfamoyl group, an N-alkylarylsulfamoyl group, a phosphono group (—$PO_3H_2$) and a conjugated base group thereof (hereinafter referred to as a "phosphonato group"), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugated-base group thereof (hereinafter referred to as an "alkyl phosphonato group"), a monoarylphosphono group (—$PO_3H(aryl)$) and a conjugated base group thereof (hereinafter referred to as an "aryl phosphonato group"), a phosphonooxy group (—$OPO_3H_2$) and a conjugated base group thereof (hereinafter referred to as an "phosphonato oxy group"), a dialkylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkylphosphonooxy group (—$OPO_3H(alkyl)$) and a conjugated base group thereof (hereinafter referred to as an "alkyl phosphonato oxy group"), a monoarylphosphonooxy group (—$OPO_3H(aryl)$) and a conjugated base group thereof (hereinafter referred to as an "aryl phosphonato oxy group"), a cyano group, a nitro group, an aryl group and an alkenyl group. Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonato phenyl group. Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butenyl group and a trimethylsilylethynyl group. Examples of the group represented by $R^{14'}$ in the acyl group ($R^{14'}CO-$) include hydrogen and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkyl phosphonato group, a monoarylphosphono group, an aryl phosphonato group, a phosphonooxy group, a phosphonato oxy group, an aryl group and an alkenyl group. Examples of the alkylene group in the substituted alkyl group include a divalent organic residue resulting from removal of any one of hydrogen atoms on the above-described alkyl group having from 1 to 20 carbon atoms, preferably a linear alkylene group having from 1 to 12 carbon atoms, a branched alkylene group having from 3 to 12 carbon atoms and a cyclic alkylene group having from 5 to 10 carbon atoms. Preferred specific examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, N-methyl-N-(sulfophenyl)carbamoylmethyl group, a sulfobutyl group, a sulfonato butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyl group, an octyl group, a phosphonobutyl group, a phosphonato hexyl group, a diethylphosphonobutyl group, a diphenylphosphonopropyl group, a methylphosphonobutyl group, a methyl phosphonato butyl group, a tolylphosphonohexyl group, a tolyl phosphonato hexyl group, a phosphonooxypropyl group, a phosphonato oxybutyl group, a benzyl group, a phenetyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group represented by $R^{4'}$ or $R^{9'}$ in partial structural formulae (A-1) and (A-2) includes a condensed ring formed by from 1 to 3 benzene rings and a condensed ring formed by a benzene ring and a 5-membered unsaturated ring and specific examples thereof include a phenyl group, a naphthyl group, an anthryl group, a phenanthryl group, an indenyl group, an acenaphthenyl group and a fluorenyl group, with a phenyl group and a naphthyl group being preferred.

The substituted aryl group includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonato phenyl group, a sulfamoylphenyl group, an N-ethylsulfamoylphenyl group, ah N,N-dipropylsulfamoylphenyl group, an N-tolylsulfamoylphenyl group, an N-methyl-N(phosphonophenyl)sulfamoylphenyl group, a phosphonophenyl group, a phosphonato phenyl group, a diethylphosphonophenyl group, a diphenylphosphonophenyl group, a methylphosphonophenyl group, a methylphosphonato phenyl group, a tolylphosphonophenyl group, a tolylphosphonato phenyl group, an allyl group, a 1-propenylmethyl group, a 2-butenyl group, a 2-methylallylphenyl group, a 2-methylpropenylphenyl group, a 2-propenylphenyl group, a 2-butylphenyl group and a 3-butylphenyl group.

The alkenyl group or substituted alkenyl group and the alkynyl group or substituted alkynyl group are represented by formulae: $-C(R^{15'})=C(R^{16'})(R^{17'})$ and $-C\equiv C(R^{18'})$, wherein $R^{15'}$, $R^{16'}$, $R^{17'}$ and $R^{18'}$ each represents a monovalent nonmetallic atom group. Preferred examples of $R^{15'}$, $R^{16'}$, $R^{17'}$ or $R^{18'}$ include a hydrogen atom, a halogen atom, an alkyl group, a substituted alkyl group, an aryl group and a substituted aryl group. Specific examples of these groups include those described above. The substituent for $R^{15'}$, $R^{16'}$, $R^{17'}$ or $R^{18'}$ is more preferably a hydrogen atom, a halogen atom or a linear, branched or cyclic alkyl group having from 1 to 10 carbon atoms. $R^{4'}$ and $R^{9'}$ in this embodiment each is preferably a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propyl group or a phenylethynyl group.

More preferred specific examples of $R^{4'}$ and $R^{9'}$ in partial structural formulae (A-1) and (A-2) include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, an allyl group, a 1-propenylmethyl group, a 2-butenyl group, a 2-methylallyl group, a 2-methylpropenyl group, a 2-propynyl group, a 2-butynyl group, a 3-butynyl group, a benzyl group, a phenetyl group, an α-methylbenzyl group, a 1-methyl-1-phenetyl group, a p-methylbenzyl group, a cinnamyl group, a hydroxyethyl group, a methoxyethyl group, a phenoxyethyl group, an aryloxyethyl group, a methoxyethoxyethyl group, an ethoxyethoxyethyl group, a morpholinoethyl group, a morpholinopropyl group, a sulfopropyl group, a sulfonato propyl group, a sulfobutyl group, a sulfonato butyl group, a carboxymethyl group, a carboxyethyl group, a carboxypropyl group, a methoxycarbonylethyl group, a 2-ethylhexyloxycarbonylethyl group, a phenoxycarbonylmethyl group, a methoxycarbonylpropyl group, an N-methylcarbamoylethyl group, an N,N-ethylaminocarbamoylmethyl group, an N-phenylcarbamoylpropyl group, an N-tolylsulfamoylbutyl group, a p-trienesulfonylaminopropyl group, a benzoylaminohexyl group, a phosphonomethyl group, a phosphonoethyl group, a phosphonopropyl group, a p-phosphonobenzylaminocarbonylethyl group, a phosphonato methyl group, a phosphonato propyl group, a phosphonato butyl group, a p-phosphonato benzylaminocarbonylethyl group, a vinyl group and an ethynyl group.

Preferred examples of $R^{5'}$, $R^{6'}$, $R^{7'}$, $R^{8'}$, $R^{10'}$, $R^{11'}$, $R^{12'}$ and $R^{13'}$ in partial structural formulae (A-1) and (A-2) are described below in detail.

The halogen atom is more preferably a fluorine atom, a chlorine atom, a bromine atom or a iodine atom.

Preferred examples of the alkyl group, the substituted alkyl group, the aryl group, the substituted aryl group, the alkenyl group and the substituted alkenyl group include those described above for $R^{4'}$ and $R^{9'}$.

The substituted oxy group ($R^{19'}O$—) includes those where $R^{19'}$ is a monovalent nonmetallic atom group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonato oxy group. The alkyl group or the aryl group in the these groups includes those described above for the alkyl group and the substituted alkyl group or those described above for the aryl group and the substituted aryl group, respectively. The acyl group ($R^{20'}CO$—) in the acyloxy group include those where $R^{20'}$ is the above-described alkyl group, substituted alkyl group, aryl group or substituted aryl group as described for $R^{4'}$ and $R^{9'}$. Among these, more preferred are an alkoxy group, an aryloxy group, an acyloxy group and an arylsulfoxy group. Preferred specific examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenetyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonato oxy group.

The substituted thio group ($R^{21'}S$—) includes those where $R^{21'}$ is a monovalent nonmetallic atom group exclusive of hydrogen. Preferred examples of the substituted thio group include an alkylthio group, an arylthio group, an alkyldithio group, an aryldithio group and an acylthio group. The alkyl group or the aryl group in these groups includes those described above for the alkyl group and the substituted alkyl group or those described above for the aryl group and the substituted aryl group, respectively. $R^{20'}$ of the acyl group ($R^{20'}C$—) in the acylthio group has the same meaning as defined above. Among these, an alkylthio group and an arylthio group are more preferred. Preferred specific examples of the substituted thio group include a methylthio group, an ethylthio group, a phenylthio group, an ethoxyethylthio group, a carboxyethylthio group and a methoxycarbonylthio group.

The substituted amino group ($R^{22'}NH$—, ($R^{23'}$)($R^{24'}$)$N$—) include those where $R^{22'}$, $R^{23'}$ and $R^{24'}$ each is a monovalent nonmetallic atom group exclusive of hydrogen. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N -aryl-N-alkylureido group, an N,-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group or the aryl group in these groups includes those described above for the alkyl group and the substituted alkyl group or those described above for the aryl group and the substituted aryl group, respectively, and $R^{20'}$ of the acyl group ($R^{20'}CO$—) in the acylamino group, the N-alkylacylamino group or the N-arylacylamino group has the same meaning as defined above. Among these groups, more preferred are an N-alkylamino group, an N,N-dialkylamino group, an N-arylamino group and an acylamino group. Preferred specific examples of the substituted amino group include a methylamino group, an ethylamino group, a diethylamino group, a morpholino group, a piperidino group, a pyrrolidino group, a phenylamino group, a benzoylamino group and an acetylamino group.

The substituted carbonyl group ($R^{25'}$—$CO$—) includes those where $R^{25'}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group or the aryl group in these groups includes those described above for the alkyl group and the substituted alkyl group or those described above for the aryl group and the substituted aryl group, respectively. The substituent is more preferably a formyl group, an acyl group, a carboxyl group, an alkoxycarbonyl group, an aryloxycarbonyl group, a carbamoyl group, an N-alkylcarbamoyl group, an N,N-dialkylcarbamoyl group or an N-arylcarbamoyl group, still more preferably a formyl group, an acyl group, an alkoxycarbonyl group or an aryloxycarbonyl group. Specific examples of preferred substituents include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

The substituted sulfinyl group ($R^{26'}$—SO—) includes those where $R^{26'}$ is a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group or the aryl group in these groups includes those described above for the alkyl group and the substituted alkyl group or those described above for the aryl group and the substituted aryl group, respectively. Among these, more preferred are an alkylsulfinyl group and an arylsulfinyl group. Specific examples of the substituted sulfinyl group include a hexylsulfinyl group, a benzylsulfinyl group and tolylsulfinyl group.

The substituted sulfonyl group ($R^{27'}$—$SO_2$—) include those where $R^{27'}$ is a monovalent nonmetallic atom group. More preferred examples thereof include an alkylsulfonyl group and an arylsulfonyl group. The alkyl group or the aryl group in these groups includes those described above for the alkyl group and the substituted alkyl group or those described above for the aryl group and the substituted aryl group, respectively. Specific examples of the substituted sulfonyl group include a butylsulfonyl group and a chlorophenylsulfonyl group.

The sulfonato group ($-SO_3^-$) means a conjugated base anion group of a sulfo group (—$SO_3H$) as described above and it is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group means a compound resulting from substitution of one or two hydroxyl groups on the phosphono group by other organic oxo groups and preferred examples thereof include a dialkylphosphono group, a diarylphosphono group, an alkylarylphosphono group, a monoalkylphosphono group and a monoarylphosphono group. Among these, preferred are a dialkylphosphono group and a diarylphosphono group. Specific examples thereof include a diethylphosphono group, a dibutylphosphono group and a diphenylphosphono group.

The phosphonato group (—$PO_3^{2-}$, —$PO_3H^-$) means a conjugated base anion group derived from acid first dissociation or acid second dissociation of a phosphono group (—$PO_3H_2$). It is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonato group is a conjugated base anion group of a substituted phosphono group where one hydroxyl group is substituted by an organic oxo group, among the above-described substituted phosphono groups. Specific examples thereof include a conjugated base group of a monoalkylphosphono group (—$PO_3H$(alkyl)) and a conjugated base group of a monoarylphosphono group (—$PO_3H$(aryl)). The substituted phosphonato group is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$$Zn^{2+}$)

As the silyl group, a trialkylsilyl group is preferred.

Among examples described above for $R^{5'}$, $R^{6'}$, $R^{7'}$, $R^{8'}$, $R^{10'}$, $R^{11'}$, $R^{12'}$ and $R^{13'}$, more preferred are a hydrogen atom, a halogen atom (—F, —Cl, —Br, —I), an alkyl group, a substituted alkyl group, an aryl group, a hydroxyl group (—OH), a substituted thio group, a substituted amino group, a substituted carbonyl group, a sulfo group, a sulfonato group and a cyano group, and still more preferred is a substituted alkyl group with the substituent thereon being a halogen atom or —$OR^{28'}$ (wherein $R^{28'}$ represents the group described above for the alkyl group, the substituted alkyl group, the aryl group or the substituted aryl group).

The ring formed by combining $R^{5'}$ and $R^{6'}$, $R^{6'}$ and $R^{7'}$, $R^{7'}$ and $R^{8'}$, $R^{10'}$ and $R^{11'}$ or $R^{12'}$ and $R^{13'}$ with each other is described below. Examples of the aliphatic ring formed by combining $R^{5'}$ and $R^{6'}$, $R^{6'}$ and $R^{7'}$, $R^{7'}$ and $R^{8'}$, $R^{10'}$ and $R^{11'}$ or $R^{12}$ and $R^{13}$ with each other include 5-membered, 6-membered, 7-membered and 8-membered aliphatic rings. More preferred are 5-membered and 6-membered aliphatic rings. The aliphatic ring may further have a substituent on the carbon atoms constituting the ring (examples of the substituent include the above-described substituents on the substituted alkyl group) or a part of the carbon atoms constituting the ring may be substituted by a hetero atom (e.g., oxygen atom, sulfur atom, nitrogen atom).

Examples of the aromatic ring formed by combining $R^{5'}$ and $R^{6'}$, $R^{6'}$ and $R^{7'}$, $R^{7'}$ and $R^{8'}$, $R^{10'}$ and $R^{11'}$ or $R^{12'}$ and $R^{13'}$ with each other include those which form a quinoline ring, an isoquinoline ring, an acridine ring, a phenanthridine ring, a benzquinoline ring or a benzisoquinoline ring, more preferably a quinoline ring, in cooperation with the pyridine ring containing the carbon atom to which $R^{5'}$, $R^{6'}$, $R^{7'}$, $R^{8'}$, $R^{10'}$, $R^{11'}$, $R^{12'}$ or $R^{13'}$ is bonded. The aromatic ring may have a substituent on the carbon atom constituting the ring (examples of the substituent include the above-described substituents on the substituted alkyl group).

Preferred examples of —X— and $R^{1'}$ in formula (IB) are described below. —X— represents —O—, —S—, —$NR^{2'}$ or —$CONR^{3'}$— and forms a 5- or 6-membered ring containing a nitrogen atom. Preferred examples of the alkyl group, the substituted alkyl group, the aryl group, the substituted aryl group, the alkenyl group, the substituted alkenyl group, the alkynyl group or the substituted alkynyl group as the substituent $R^{1'}$, $R^{2'}$ or $R^{3'}$ on the nitrogen atom of the above-described 5- or 6-membered ring include those described above for $R^{4\circ}$ and $R^9$ in partial structural formulae (A-1) and (A-2). —X— is more preferably —O—, —S— or —$NR^{2'}$—, still more preferably —S— or —$NR^{2'}$— and most preferably —S—.

The substituted or unsubstituted 1,3-dihydro-1-oxo-2H- indene-2-ylidene group as =E in formula (IB) is represented by partial structural formula (B):

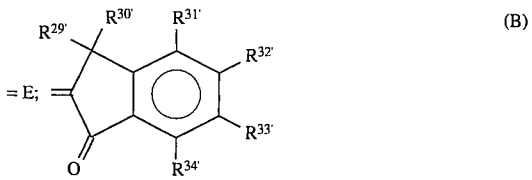

In formula (B), $R^{29'}$, $R^{30'}$, $R^{31'}$, $R^{32'}$, $R^{33'}$ and $R^{34'}$ each independently represents a monovalent nonmetallic atom group, more preferably a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group. Preferred examples of the substituent for these groups include those described above for $R^{5'}$, $R^{6'}$, $R^{7'}$, $R^{8'}$, $R^{10'}$, $R^{11'}$, $R^{12'}$ and $R^{13'}$ in partial structural formulae (A-1) and (A-2).

$R^{29'}$ and $R^{30'}$ may be combined together to form an aliphatic ring to form a spiro ring in combination with the ring containing the carbon atom to which $R^{29'}$ or $R^{30'}$ is bonded. The aliphatic ring is preferably a 5-membered, 6-membered, 7-membered or 8-membered aliphatic ring, more preferably a 5-membered or 6-membered aliphatic ring. The aliphatic ring may further have a substituent on the carbon atoms constituting the ring (examples of the substituent include the above-described substituents on the substituted alkyl group as an example of $R^{4'}$ or $R^{9'}$) or a part of the carbon atoms constituting the ring may be substituted by a hetero atom (e.g., oxygen atom, sulfur atom, nitrogen atom). Preferred specific examples of the aliphatic ring include a cyclopentane ring, a cyclohexane ring, a cycloheptane ring, a cyclooctane ring, a cyclo-1,3-dioxapentane ring, a cyclopentene ring, a cyclohexene ring, a cycloheptene ring, a cyclooctene ring, a cyclo-1,3-dioxapentene ring and a cyclo-1,3-dioxahexene ring.

$R^{31'}$ and $R^{32'}$, $R^{32'}$ and $R^{33'}$ or $R^{33'}$ and $R^{34'}$ may be preferably combined together to form an aliphatic or aromatic ring. The aliphatic ring includes 5-membered, 6-membered, 7-membered and 8-membered aliphatic rings, with 5-membered and 6-membered aliphatic rings being more preferred. The aliphatic ring may further have a substituent on the carbon atoms constituting the ring (examples of the substituent include the substituents described above for $R^{5'}$ to $R^{13'}$) or a part of the carbon atoms constituting the ring may be substituted by a hetero atom (e.g., oxygen atom, sulfur atom, nitrogen atom). Preferred specific examples of the aliphatic ring include those which form a benzocyclopentane ring, a benzocyclohexane ring, a benzocycloheptene ring, a benzocyclooctane ring, a 1,3-benzocyclohexadiene ring, a 1,3-dihydro-1,3-dioxaindene ring or a julolidine ring in cooperation with the benzene ring containing the carbon atom to which $R^{31'}$, $R^{32'}$, $R^{33'}$ or $R^{34'}$ is bonded. Examples of the aromatic ring include those which form a naphthalene ring or an anthracene ring, preferably a naphthalene ring, in cooperation with the benzene ring containing the carbon atom to which $R^{31'}$, $R^{32'}$, $R^{33'}$ or $R^{34'}$ is bonded. The aromatic ring may also have a substituent on the carbon atoms constituting the ring (examples of the substituent include the substituent described above for $R^{5'}$ to $R^{13'}$).

Still more preferably, $R^{29'}$ and $R^{30'}$ each represents a hydrogen atom, a halogen atom, an alkyl group, a substituted alkyl group, an aryl group, a substituted aryl group or a substituted carbonyl group and $R^{31'}$, $R^{32'}$, $R^{33'}$ and $R^{34'}$ each represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group or a substituted carbonyl group.

Preferred specific examples of partial formula (B) are set forth below.

Partial structure (B)

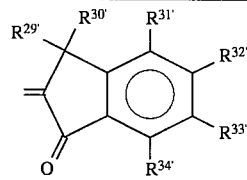

|  | $R^{29'}$ | $R^{30'}$ | $R^{31'}$ | $R^{32'}$ | $R^{33'}$ | $R^{34'}$ |
|---|---|---|---|---|---|---|
| (b'-1) | —H | —H | —H | —H | —H | —H |
| (b'-2) | —CH₃ | —H | —H | —H | —H | —H |
| (b'-3) | —CH₃ | —CH₃ | —H | —H | —H | —H |
| (b'-4) | —Ph | —H | —H | —H | —H | —H |
| (b'-5) | —Ph | —H | —H | —H | —OCH₃ | —H |
| (b'-6) | —Ph | —H | —H | —OCH₃ | —OCH₃ | —H |
| (b'-7) | —Ph | —H | —H | —OCH₃ | —OCH₃ | —OCH₃ |
| (b'-8) | —Ph | —H | —OCH₃ | —H | —H | —OCH₃ |
| (b'-9) | —Ph | —H | —CH₃ | —H | —H | —CH₃ |
| (b'-10) | —⟨C₆H₄⟩—CF₃ | —H | —H | —H | —H | —H |
| (b'-11) | —⟨C₆H₄⟩—F | —H | —H | —H | —H | —H |

-continued

Partial structure (B)

$$\begin{array}{c} R^{29'}\ R^{30'}\ R^{31'} \\ \diagup\diagdown \\ R^{32'} \\ \diagdown \\ R^{33'} \\ R^{34'}\ O \end{array}$$

| | $R^{29'}$ | $R^{30'}$ | $R^{31'}$ | $R^{32'}$ | $R^{33'}$ | $R^{34'}$ |
|---|---|---|---|---|---|---|
| (b'-12) | —⟨Ph⟩—Cl | —H | —H | —H | —H | —H |
| (b'-13) | —⟨Ph⟩—OCH₃ | —H | —H | —H | —H | —H |
| (b'-14) | —⟨Ph⟩—N(CH₃)₂ | —H | —H | —H | —H | —H |
| (b'-15) | —⟨Ph⟩(OCH₃)(OCH₃) | —H | —H | —H | —H | —H |
| (b'-16) | —Cl | —Cl | —H | —H | —H | —H |
| (b'-17) | —C(CH₃)₃ | —H | —H | —H | —H | —H |
| (b'-18) | —CH(CH₃)₂ | —H | —CH₃ | —H | —H | —H |
| (b'-19) | —H | —H | —CH₃ | —H | —H | —H |
| (b'-20) | —H | —H | —H | —CH₃ | —H | —H |
| (b'-21) | —H | —H | —H | —H | —CH₃ | —H |
| (b'-22) | —H | —H | —H | —H | —H | —CH₃ |
| (b'-23) | —CH₃ | —H | —H | —H | —CH₃ | —H |
| (b'-24) | —H | —H | —H | —H | —C(CH₃)₃ | —H |
| (b'-25) | —H | —H | —CH₃ | —H | —CH(CH₃)₂ | —H |
| (b'-26) | —H | —H | —CH(CH₃)₂ | —H | —H | —CH₃ |
| (b'-27) | —CH₃ | —CH₃ | —H | —C₂H₅ | —H | —H |
| (b'-28) | —CH₂Ph | —H | —H | —CH₃ | —H | —H |
| (b'-29) | —H | —H | —H | —CH₃ | —CH₃ | —H |
| (b'-30) | —H | —H | —CH₃ | —H | —H | —CH₃ |
| (b'-31) | —Ph | —CH₃ | —H | —H | —H | —H |
| (b'-32) | —CH₃ | —CH₃ | —H | —CH₃ | —CH₃ | —CH₃ |
| (b'-33) | —CH₃ | —CH₃ | —CH₃ | —CH₃ | —H | —CH₃ |
| (b'-34) | —CH₃ | —CH₃ | —CH₃ | —H | —H | —CH₃ |
| (b'-35) | —H | —H | —H | —CH₃ | —H | —CH₃ |
| (b'-36) | —H | —H | —CH₃ | —H | —H | —CH(CH₃)₂ |
| (b'-37) | —H | —H | —Cl | —H | —H | —H |
| (b'-38) | —H | —H | —H | —Cl | —H | —H |
| (b'-39) | —H | —H | —H | —H | —Cl | —H |
| (b'-40) | —CH₃ | —H | —H | —Cl | —H | —H |
| (b'-41) | —H | —H | —Cl | —H | —H | —CH₃ |
| (b'-42) | —H | —H | —CH₃ | —H | —H | —Cl |
| (b'-43) | —H | —H | —Br | —H | —H | —H |
| (b'-44) | —H | —H | —H | —Br | —H | —H |
| (b'-45) | —H | —H | —H | —H | —I | —H |
| (b'-46) | —H | —H | —CH(CH₃)₂ | —H | —H | —Br |
| (b'-47) | —H | —H | —Br | —H | —H | —CH(CH₃)₂ |
| (b'-48) | —H | —H | —CH₃ | —H | —H | —Br |
| (b'-49) | —H | —H | —Br | —H | —H | —CH₃ |
| (b'-50) | —H | —H | —OH | —H | —H | —H |
| (b'-51) | —H | —H | —H | —OH | —H | —H |
| (b'-52) | —H | —H | —OC₂H₅ | —H | —H | —H |
| (b'-53) | —H | —H | —H | —OCH₃ | —H | —H |
| (b'-54) | —H | —H | —H | —H | —OCH₃ | —H |
| (b'-55) | —H | —H | —OCH₃ | —OCH₃ | —H | —H |
| (b'-56) | —H | —H | —H | —OCH₃ | —OCH₃ | —H |
| (b'-57) | —H | —H | —H | —OCH₃ | —H | —OCH₃ |
| (b'-58) | —H | —H | —OCH₃ | —OCH₃ | —OCH₃ | —H |
| (b'-59) | —H | —H | —H | —OCH₃ | —OCH₃ | —OCH₃ |
| (b'-60) | —H | —H | —OH | —H | —H | —OH |
| (b'-61) | —H | —H | —H | —N(CH₃)₂ | —H | —H |

Partial structure (B)
| | $R^{29'}$ | $R^{30'}$ | $R^{31'}$ | $R^{32'}$ | $R^{33'}$ | $R^{34'}$ |
|---|---|---|---|---|---|---|
| (b'-62) | —H | —H | —H | —SCH$_3$ | —H | —H |
| (b'-63) | —H | —H | —H | —OC$_2$H$_5$CO$_2$H | —H | —H |
| (b'-64) | —H | —H | —H | —OC$_2$H$_5$CO$_2$CH$_3$ | —H | —H |
| (b'-65) | —H | —H | —H | —H | —CO$_2$H | —H |
| (b'-66) | —H | —H | —H | —H | —CO$_2$C$_2$H$_5$ | —H |
| (b'-67) | —H | —H | —H | —Ph | —H | —H |
| (b'-68) | —H | —H | —NO$_2$ | —H | —H | —H |
| (b'-69) | —CH$_3$ | —CH$_3$ | —H | —H | —NO$_2$ | —H |
| (b'-70) | —CO$_2$H | —H | —H | —H | —H | —H |
| (b'-71) | —CH$_2$CO$_2$H | —H | —H | —H | —H | —H |
| (b'-72) | —CO$_2$C$_2$H$_5$ | —H | —H | —H | —H | —H |
(b'-73)
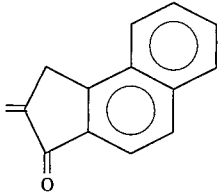
(b'-74)
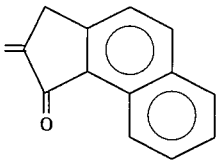
(b'-75)
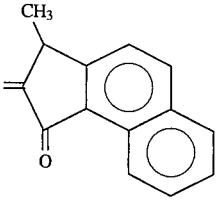
(b'-76)
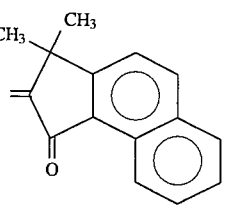
(b'-77)
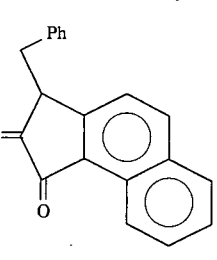
(b'-78)
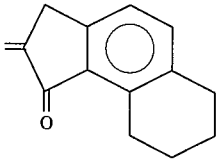

| Partial structure (B) | 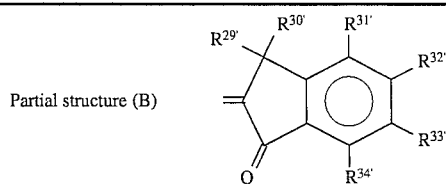 | | | | |
|---|---|---|---|---|---|
| $R^{29'}$ | $R^{30'}$ | $R^{31'}$ | $R^{32'}$ | $R^{33'}$ | $R^{34'}$ |
| (b'-79) | 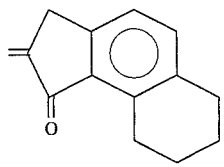 | | | | |
| (b'-80) | 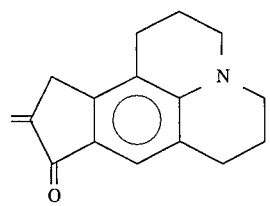 | | | | |
| (b'-81) | 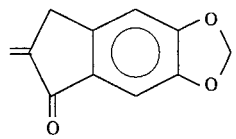 | | | | |
| (b'-82) | 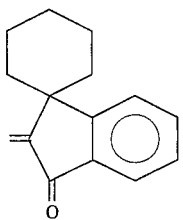 | | | | |
| (b'-83) | 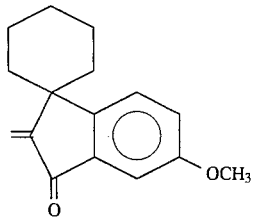 | | | | |

The compound represented by formula (IB) can be constituted by combining the partial structure A= represented by partial structural formula (A-1) or (A-2) with the partial structure =E represented by partial structural formula (B) on the formula (IB). Preferred specific examples of the compound represented by formula (IB) are set forth below.

| | $R^{4'}$ | $R^{5'}$ | $R^{6'}$ | $R^{7'}$ | $R^{8'}$ | $-X-$ | $R^{1'}$ | $R^{29'}$ | $R^{30'}$ | $R^{31'}$ | $R^{32'}$ | $R^{33'}$ | $R^{34'}$ |
|---|---|---|---|---|---|---|---|---|---|---|---|---|---|
| (IB-1) | $-C_7H_{15}$ | $-H$ | $-H$ | $-H$ | $-H$ | $-S-$ | $-C_2H_5$ | $-H$ | $-H$ | $-H$ | $-H$ | $-H$ | $-H$ |
| (IB-2) | $-C_3H_7$ | $-H$ | $-H$ | $-H$ | $-H$ | $-S-$ | $-CH_2CH=CH_2$ | $-H$ | $-H$ | $-H$ | $-H$ | $-H$ | $-H$ |
| (IB-3) | $-C_4H_9$ | $-H$ | $-H$ | $-H$ | $-H$ | $-S-$ | $-CH_2CO_2H$ | $-H$ | $-H$ | $-H$ | $-OCH_3$ | $-OCH_3$ | $-H$ |
| (IB-4) | $-C_5H_{11}$ | $-H$ | $-H$ | $-H$ | $-H$ | $-S-$ | $-(CH_2)_2CO_2H$ | $-H$ | $-H$ | $-H$ | $-OCH_3$ | $-OCH_3$ | $-H$ |
| (IB-5) | $-C_6H_{13}$ | $-H$ | $-H$ | $-H$ | $-H$ | $-S-$ | ![SO3-phenyl] | $-H$ | $-H$ | $-H$ | $-OCH_3$ | $-OCH_3$ | $-OCH_3$ |
| (IB-6) | $-C_8H_{17}$ | $-H$ | $-H$ | $-H$ | $-H$ | $-S-$ | $-(CH_2)_2N\text{-morpholino}$ | $-H$ | $-H$ | $-CH_3$ | $-H$ | $-H$ | $-Br$ |
| (IB-7) | $-CHCH=CH_2$ | $-H$ | $-H$ | $-OCH_3$ | $-H$ | $-S-$ | $-(CH_2)_3N\text{-morpholino}$ | $-H$ | $-H$ | $-Br$ | $-H$ | $-H$ | $-CH_3$ |
| (IB-8) | $-CH_2CO_2H$ | $-H$ | $-H$ | $-CH_3$ | $-H$ | $-S-$ | $-(CH_2)_2OCH_3$ | $-H$ | $-H$ | $-H$ | $-H$ | $-Cl$ | $-H$ |
| (IB-9) | $-(CH_2)_2CO_2H$ | $-H$ | $-H$ | $-H$ | $-H$ | $-S-$ | $-CH_3$ | $-Ph$ | $-H$ | $-H$ | $-H$ | $-H$ | $-H$ |
| (IB-10) | $-(CH_2)_3SO_3^\ominus$ | $-H$ | $-H$ | $-H$ | $-H$ | $-S-$ | $-CH_3$ | $-CH_3$ | $-H$ | $-H$ | $-H$ | $-OCH_3$ | $-H$ |
| (IB-11) | $-(CH_2)_4SO_3^\ominus$ | $-H$ | $-H$ | $-H$ | $-H$ | $-S-$ | $-CH_2Ph$ | $-CH_3$ | $-CH_3$ | $-OCH_3$ | $-H$ | $-OCH_3$ | $-H$ |

-continued

| | R⁹ | | | R¹⁰ | R¹¹ | R¹² | R¹³ | | | | | |
|---|---|---|---|---|---|---|---|---|---|---|---|---|
| (IB-12) | -(CH₂)₂OCH₃ | | | -H | -H | -F | -H | -S- | -C₂H₅ | -H | -H | -H |
| (IB-13) | -(CH₂)₂O-(CH₂)₂OCH₃ | | | -H | -H | -H | -H | -S- | -C₂H₅ | 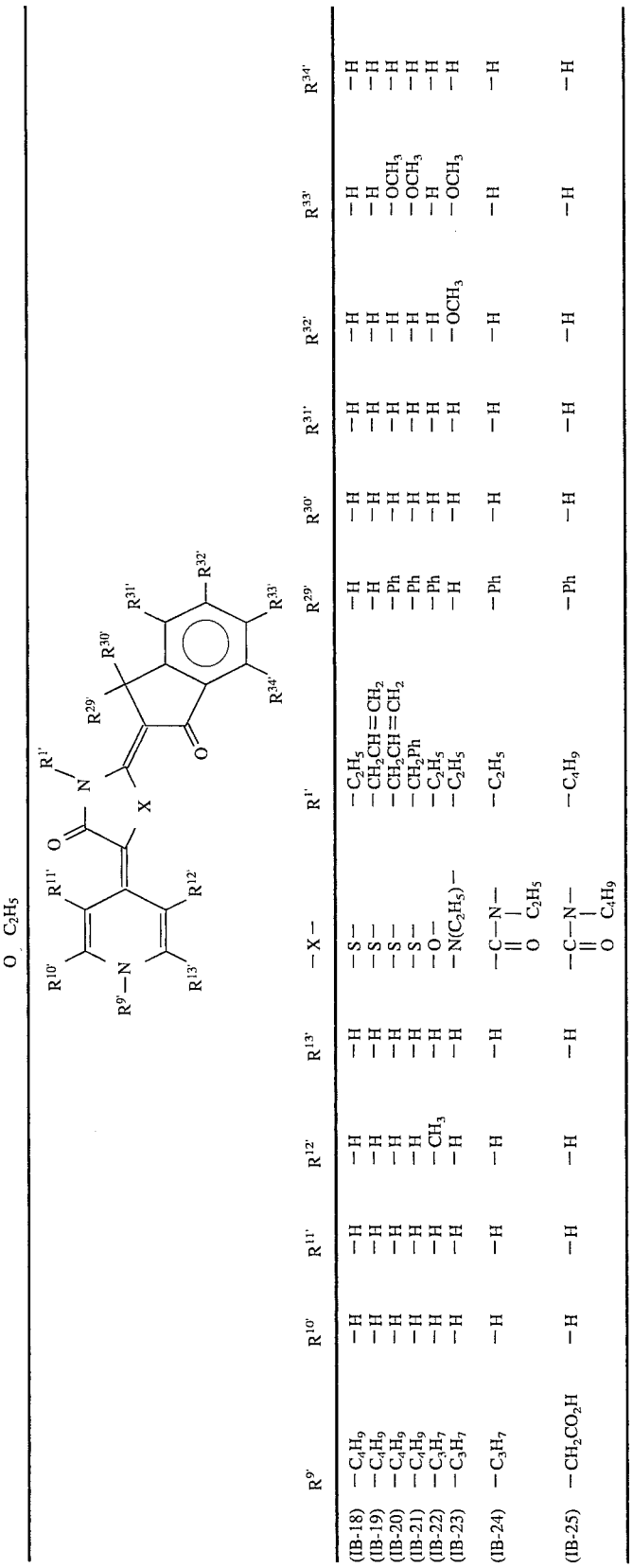 | -H | -OCH₃ | -H |
| (IB-14) | -CH₂Ph | | | -H | -H | -H | -H | -S- | -C₂H₅ | | -H | -OCH₃ | -H |
| (IB-15) | -C₄H₉ | | | -H | -H | -H | -H | -O- | -C₂H₅ | -H | -H | -H | -H |
| (IB-16) | -C₄H₉ | | | -H | -H | -H | -H | -N(CH₃)- | -CH₃ | -H | -H | -H | -H |
| (IB-17) | -C₄H₉ | | | -H | -H | -H | -H | -C-N- ‖ \| O C₂H₅ | -C₂H₅ | -H | -H | -H | -H |

| | R⁹' | R¹⁰' | R¹¹' | R¹²' | R¹³' | -X- | R¹' | R²⁹' | R³⁰' | R³¹' | R³²' | R³³' | R³⁴' |
|---|---|---|---|---|---|---|---|---|---|---|---|---|---|
| (IB-18) | -C₄H₉ | -H | -H | -H | -H | -S- | -C₂H₅ | -H | -H | -H | -H | -H | -H |
| (IB-19) | -C₄H₉ | -H | -H | -H | -H | -S- | -CH₂CH=CH₂ | -H | -H | -H | -H | -H | -H |
| (IB-20) | -C₄H₉ | -H | -H | -H | -H | -S- | -CH₂CH=CH₂ | -Ph | -H | -H | -H | -OCH₃ | -H |
| (IB-21) | -C₄H₉ | -H | -H | -CH₃ | -H | -O- | -CH₂Ph | -Ph | -H | -H | -H | -OCH₃ | -H |
| (IB-22) | -C₃H₇ | -H | -H | -H | -H | -O- | -C₂H₅ | -Ph | -H | -H | -H | -OCH₃ | -H |
| (IB-23) | -C₃H₇ | -H | -H | -H | -H | -N(C₂H₅)- | -C₂H₅ | -Ph | -H | -H | -OCH₃ | -H | -H |
| (IB-24) | -C₃H₇ | -H | -H | -H | -H | -C-N- ‖ \| O C₂H₅ | -C₂H₅ | -Ph | -H | -H | -H | -H | -H |
| (IB-25) | -CH₂CO₂H | -H | -H | -H | -H | -C-N- ‖ \| O C₄H₉ | -C₄H₉ | -Ph | -H | -H | -H | -H | -H |

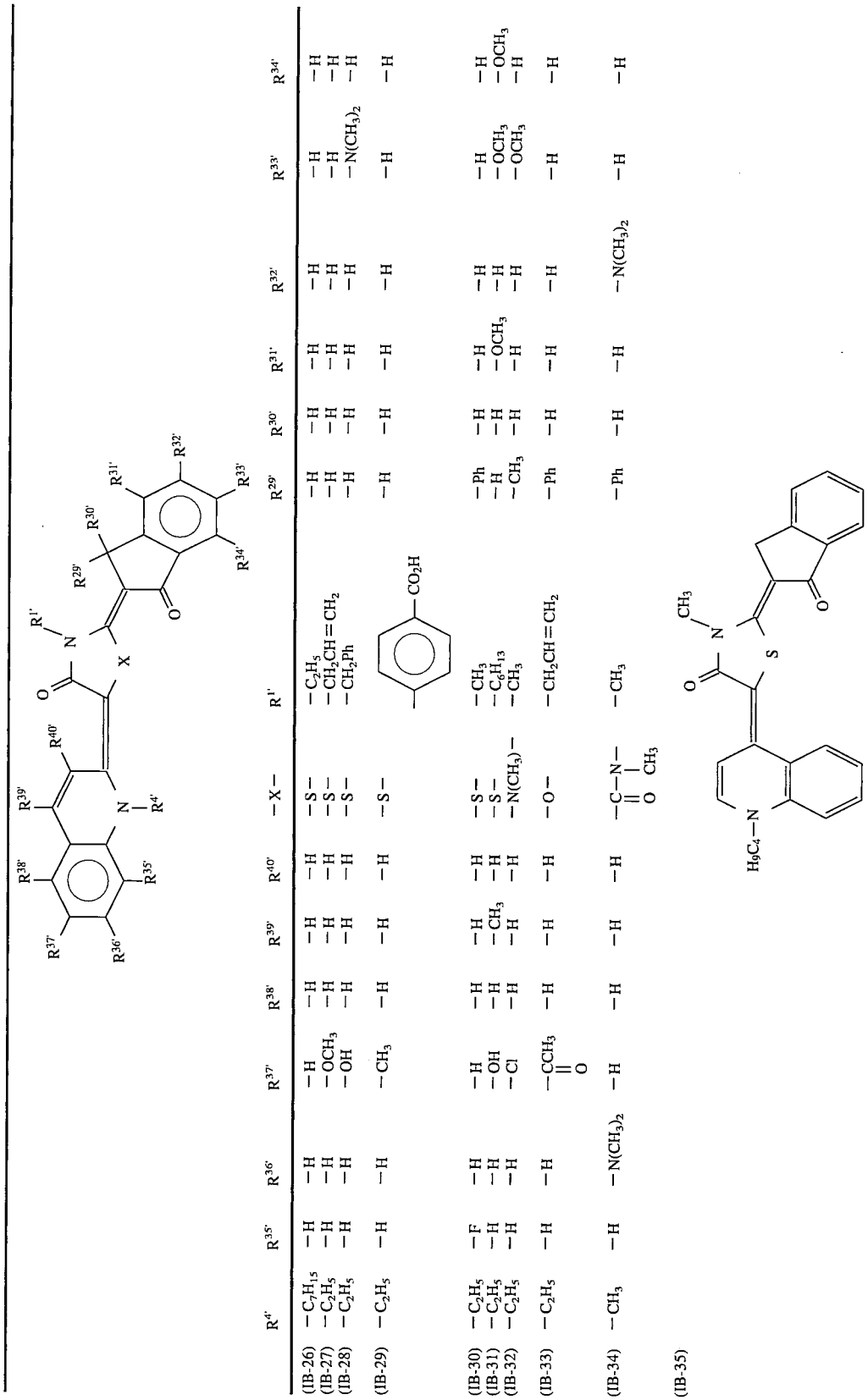

-continued
(IB-36) 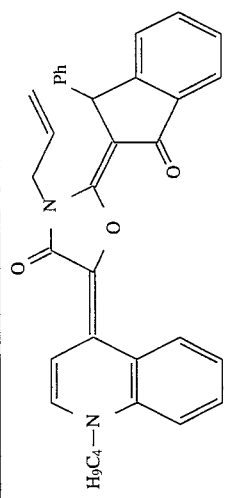
(IB-37) 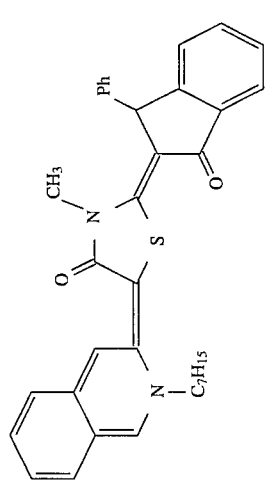
(IB-38) 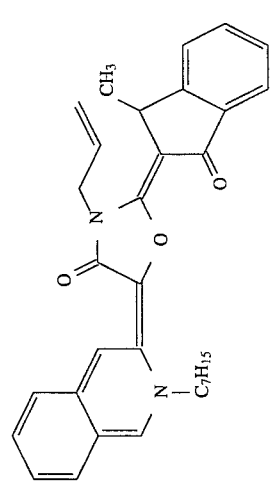
(IB-39) 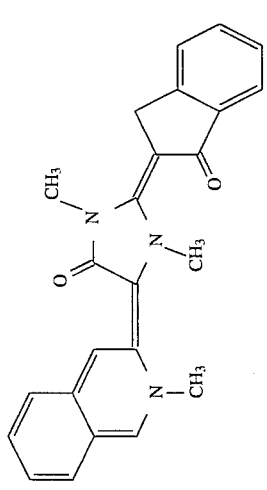

-continued
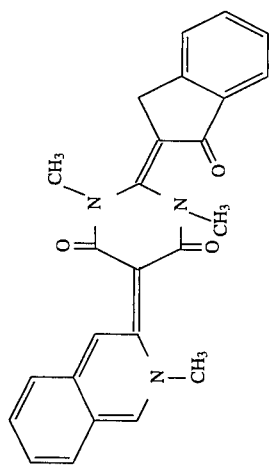
(IB-40)
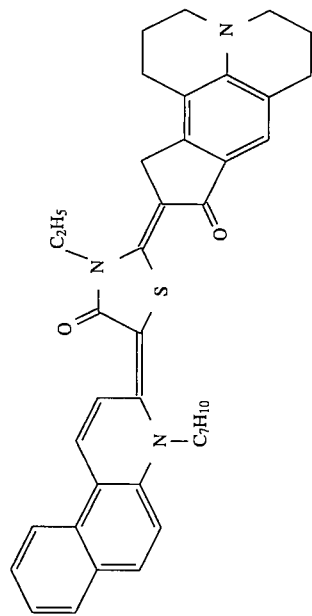
(IB-41)
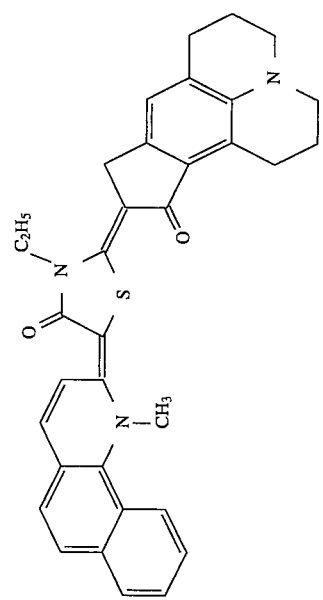
(IB-42)

The compounds represented by formulae (IA) and (IB) can be synthesized according to the methods described in *Bull. Soc. Chimie. Belges*, "Abstract", Vol. 57, pp. 364–372 (1948) and *Chemical Abstracts*, Vol. 44, columns 60c to 61d (1950). More specifically, for example, Compound (IA-1) can be produced by condensing 3-allyl-5-[3-butyl-2(3H)-benzothiazolidene]-4,5-dihydro-2-(methylthio)-4-oxothiazolium 4-methylbenzenesulfonate to 1-indanone in a basic condition and Compound (IB-1) can be produced by condensing 4,5-dihydro-3-ethyl-5-[1-heptyl-2(1H)-pyridylidene]-2-(methylthio)-4-oxothiazoium 4-methylbenzene sulfonate to 1-indanone in a basic condition. In this case, the base used may be a base in a common use such as an organic amine, pyridines (e.g., trialkylamine, dimethylaminopyridine), metal amides (e.g., lithium diisopropylamide), metal alkoxides (e.g., sodium methoxide, potassium-t-butoxide) and metal hydrides (e.g., sodium hydride). The synthesis method of the compounds represented by formulae (IA) and (IB) is by no means limited to the above-described methods.

The compound represented by formula (IA) or (IB) for use in the photopolymerizable composition of the present invention is suitably used solely or in combination of two or more thereof.

The component (iii) for use in the present invention will be described below in detail.

The compound as the component (iii) of the present invention may be any as long as it produces an active radical upon light irradiation in the presence of component (ii). More specifically, a compound which produces an active radical through an interaction (e.g., energy transfer, electron transfer, production of excited complex) with the component (ii) excited by the light irradiation can be suitably used. Examples of preferred activators include (a) a compound having a carbon halogen bond, (b) an aromatic onium salt compound, (c) an organic peroxide compound, (d) a thio compound, (e) a hexaarylbiimidazole compound, (f) a ketooxime ester compound, (g) a borate compound, (h) an azinium compound, (i) a metallocene compound and (j) an active ester compound.

Preferred examples of the compound having a carbon halogen bond as one example of the component (iii) include those represented by formulae (II), (III), (IV), (V), (VI), (VII) and (VIII):

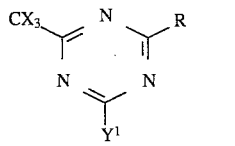
(II)

wherein X represents a halogen atom, $Y^1$ represents $—CX'_3, —NH_2, —NHR', —NR'_2$ or $—OR'$ (wherein R' represents an alkyl group, a substituted alkyl group, an aryl group or a substituted aryl group) and R represents $—CX_3$, an alkyl group, a substituted alkyl group, an aryl group, a substituted aryl group or a substituted alkenyl group;

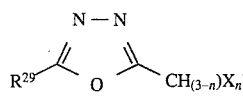
(III)

wherein $R^{29}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, X' represents a halogen atom and n represents an integer of from 1 to 3;

$$R^{30}—Z—CH_{(m-1)}X''_m—R^{31} \quad (IV)$$

wherein $R^{30}$ represents an aryl group or a substituted aryl group and $R^{31}$ represents $—C(=O)—NR^{32}R^{33}$, $—C(=S)NR^{32}R^{33}$,

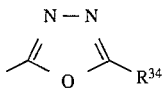

or a halogen atom, Z represents $—C(=O)—$, $—C(=S)—$ or $—SO_2—$ (wherein $R^{32}$ and $R^{33}$ each represents an alkyl group, a substituted alkyl group, an alkenyl group, a substituted alkenyl group, an aryl group or a substituted aryl group and $R^{34}$ has the same meaning as R' in formula (II)), X" represents a halogen atom and m represents 1 or 2;

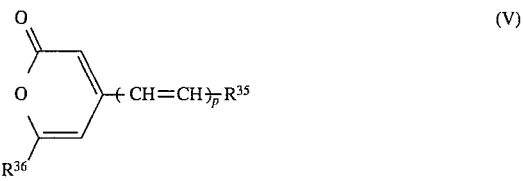
(V)

wherein $R^{35}$ represents an aryl group which may be substituted or a heterocyclic group which may be substituted, $R^{36}$ represents a trihaloalkyl or trihaloalkenyl group having from 1 to 3 carbon atoms and p represents 1, 2 or 3;

a carbonylmethylene heterocyclic compound having a trihalogenomethyl group represented by formula (VI),

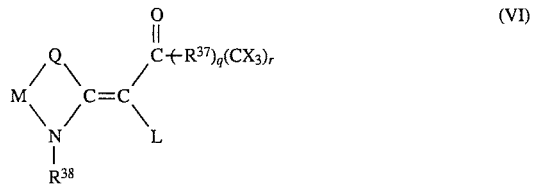
(VI)

wherein L represents a hydrogen atom or a substituent represented by formula: $CO—(R^{37})_q(CX_3)_r$, Q represents a sulfur atom, a selenium atom, an oxygen atom, a dialkylmethylene group, an alkene-1,2-ylene group, a 1,2-phenylene group or an N-R group, M represents a substituted or unsubstituted alkylene or alkenylene group or a 1,2-arylene group, $R^{38}$ represents an alkyl group, an aralkyl group or an alkoxyalkyl group, $R^{37}$ represents a carbocyclic or heterocyclic divalent aromatic group, X represents a chlorine atom, a bromine atom or an iodine atom and q=0 and r=1 or q=1 and r=1 or 2.

a 4-halogeno-5-(halogenomethylphenyl)oxazole derivative represented by formula (VII),

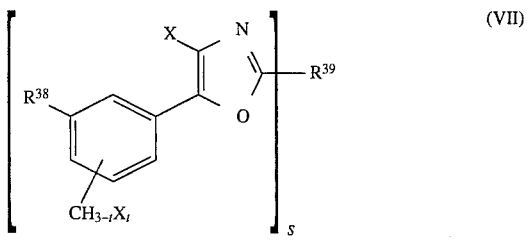
(VII)

wherein X represents a halogen atom, t represents an integer of from 1 to 3, s represents an integer of from 1 to 4, $R^{38}$ represents a hydrogen atom or a $CH_{3-t}X_t$ group and $R^{39}$ represents an s-valent unsaturated organic group which may be substituted; and a 2-(halogenomethylphenyl)-4-halogenooxazole derivative represented by formula (VIII),

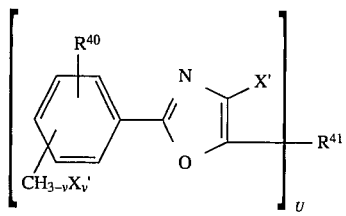

wherein X represents a halogen atom, v represents an integer of from 1 to 3, u represents an integer of from 1 to 4, $R^{40}$ represents a hydrogen atom or a $CH_{3-v}X_v$ group and $R^{41}$ represents a u-valent unsaturated organic group which may be substituted.

Specific examples of the compound having a carbonhalogen bond include:

Compounds described, for example, in Wakabayashi et al., *Bull. Chem. Soc. Japan*, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis-(trichloromethyl)-S-triazine and 2-(α,α,β-trichloroethyl)-4,6-bis(trichloromethyl)-S-triazine;

Compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

Compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]-4,6-bis-trichloromethyl-S-triazine, 2-(4,7-dimethoxynaphtho-1-yl)-4,6-bis-trichloro-methyl-S-triazine and 2-(acenaphtho-5-yl)-4,6-bis-trichloromethyl-S-triazine;

Compounds described in German Patent No. 3,337,024:

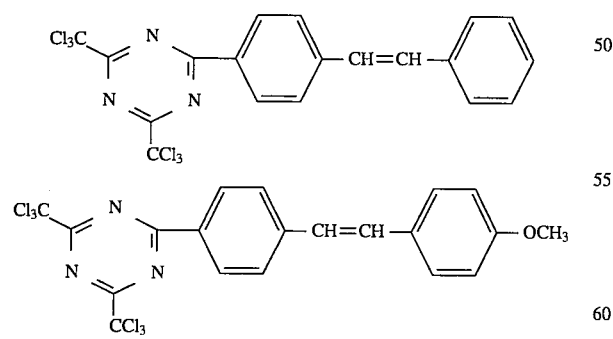

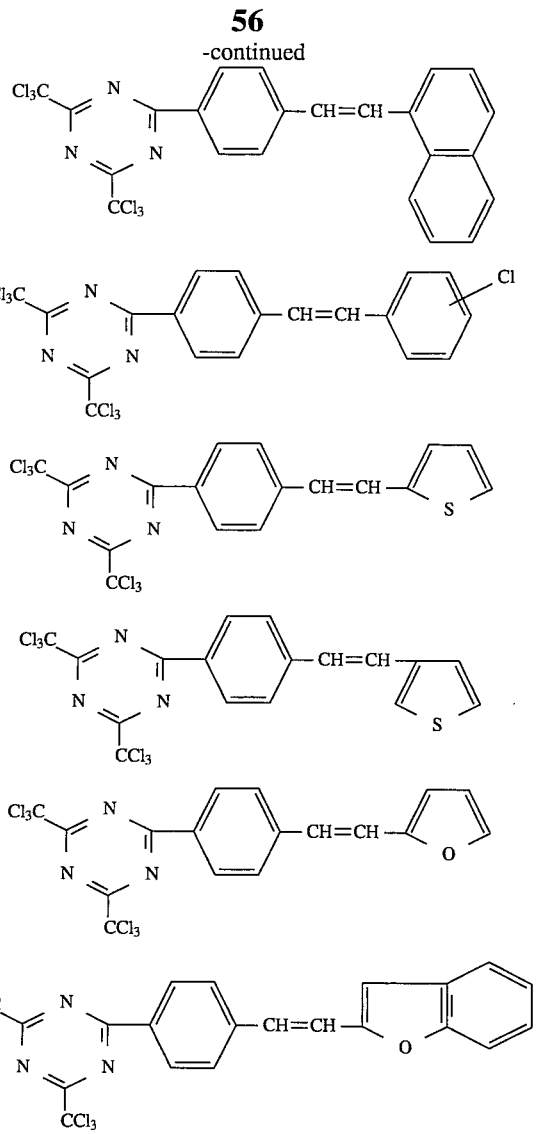

Compounds described in F. C. Schaefer et al., *J. Org. Chem.*, 29, 1527 (1964) such as 2-methyl-4,6-bis(tribromo-methyl)-S-triazine, 2,4,6-tris(tribromomethyl)-S-triazine, 2,4,5-tris(dibromomethyl)-S-triazine, 2-amino-4-methyl-6-tribromomethyl-S-triazine and 2-methoxy-4-methyl-6-trichloromethyl-S-triazine;

Compounds described in JP-A-62-58241:

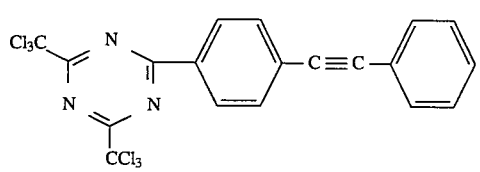

-continued
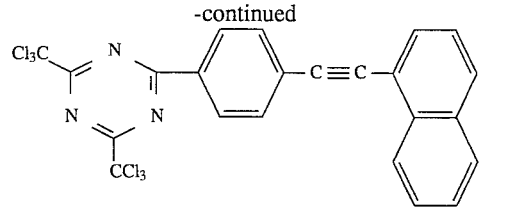
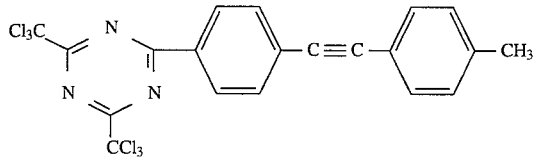
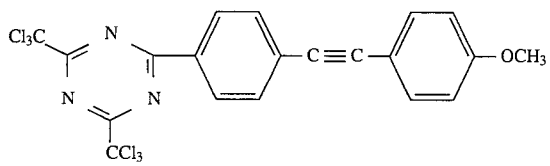
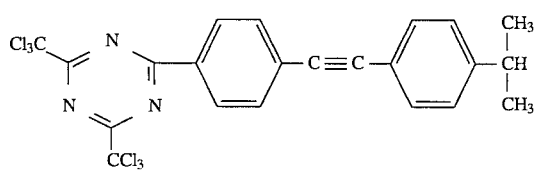
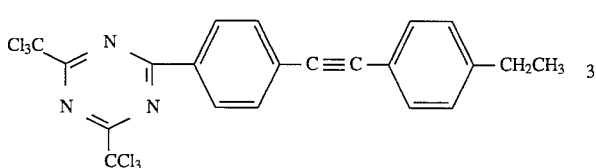
Compounds described in JP-A-5-281728:
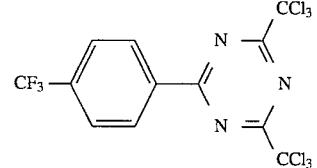
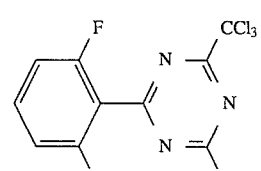
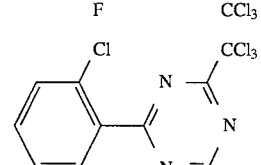
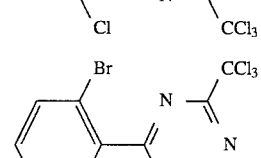
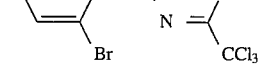
Compounds described below which can be easily synthesized by a person skilled in the art according to the synthesis method described in M. P. Hutt, E. F. Elslager and L. M. Merbel, *Journal of Heterocyclic Chemistry*, Vol. 7 (No. 3), page 511 et seq (1970):
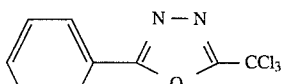
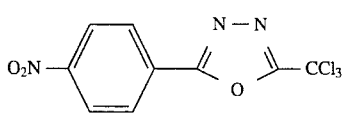
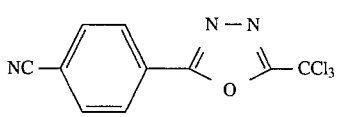
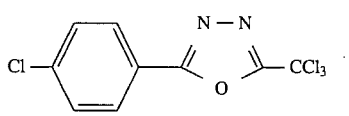
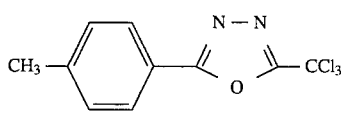
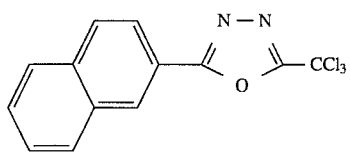
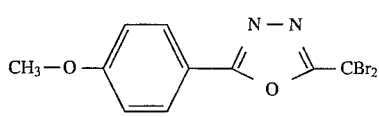
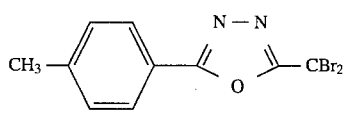
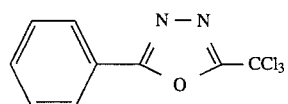
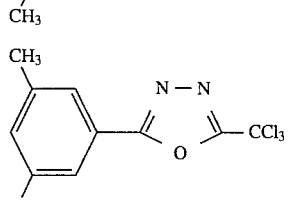
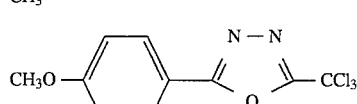
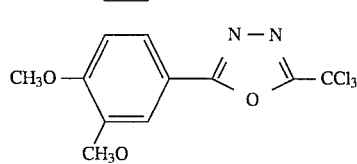

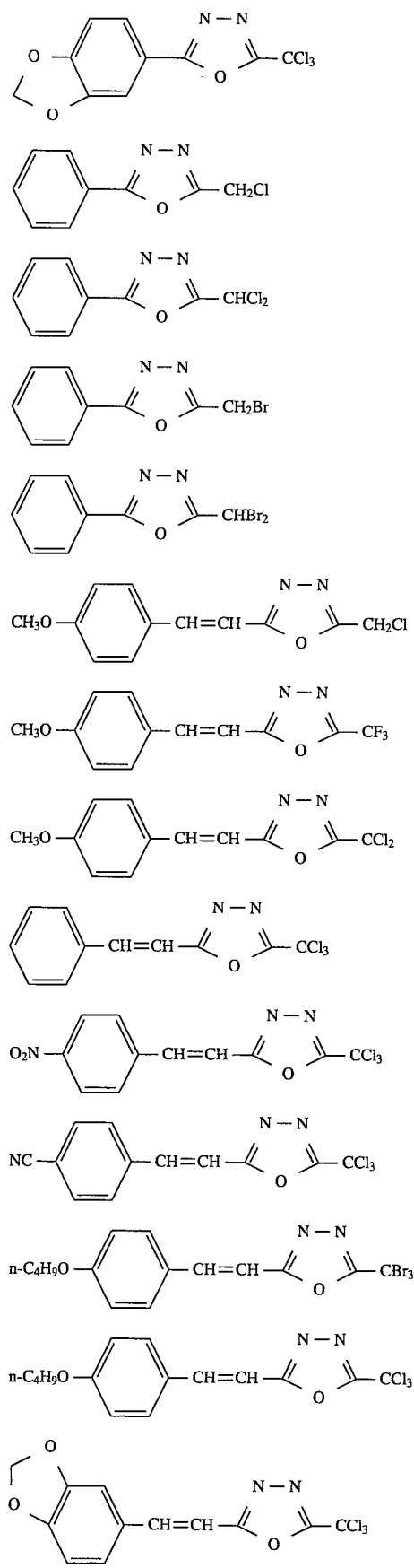
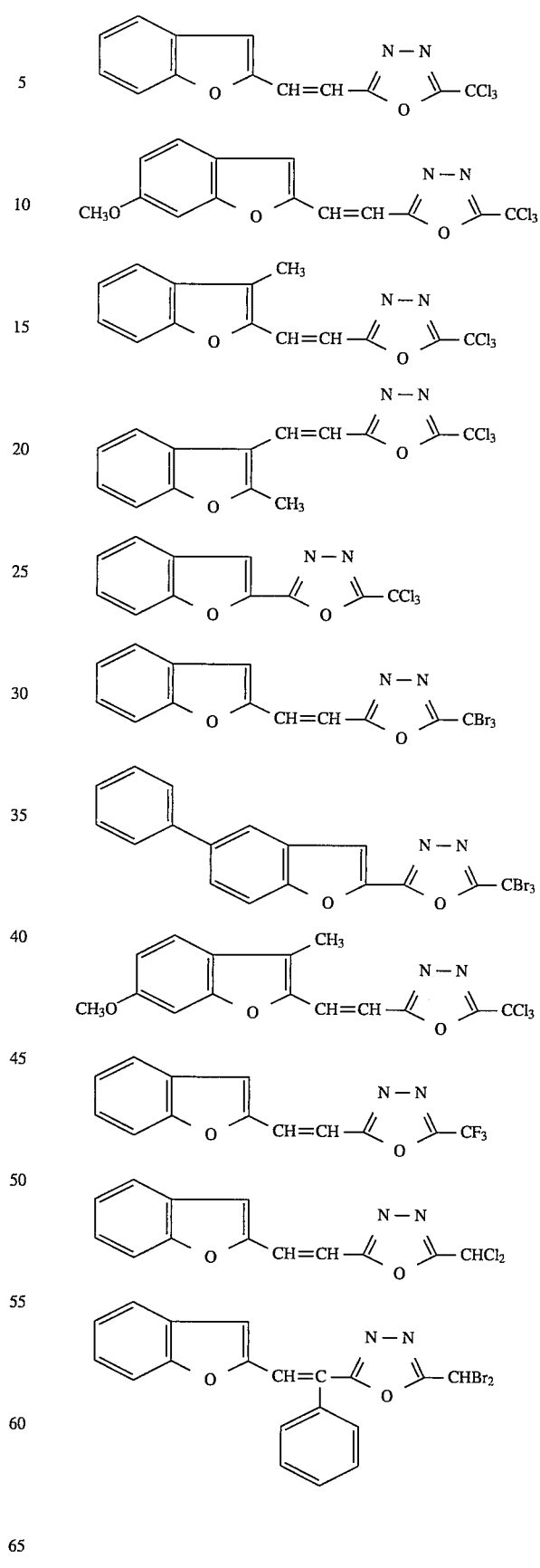

-continued
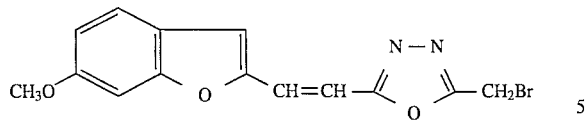
Compounds described below:
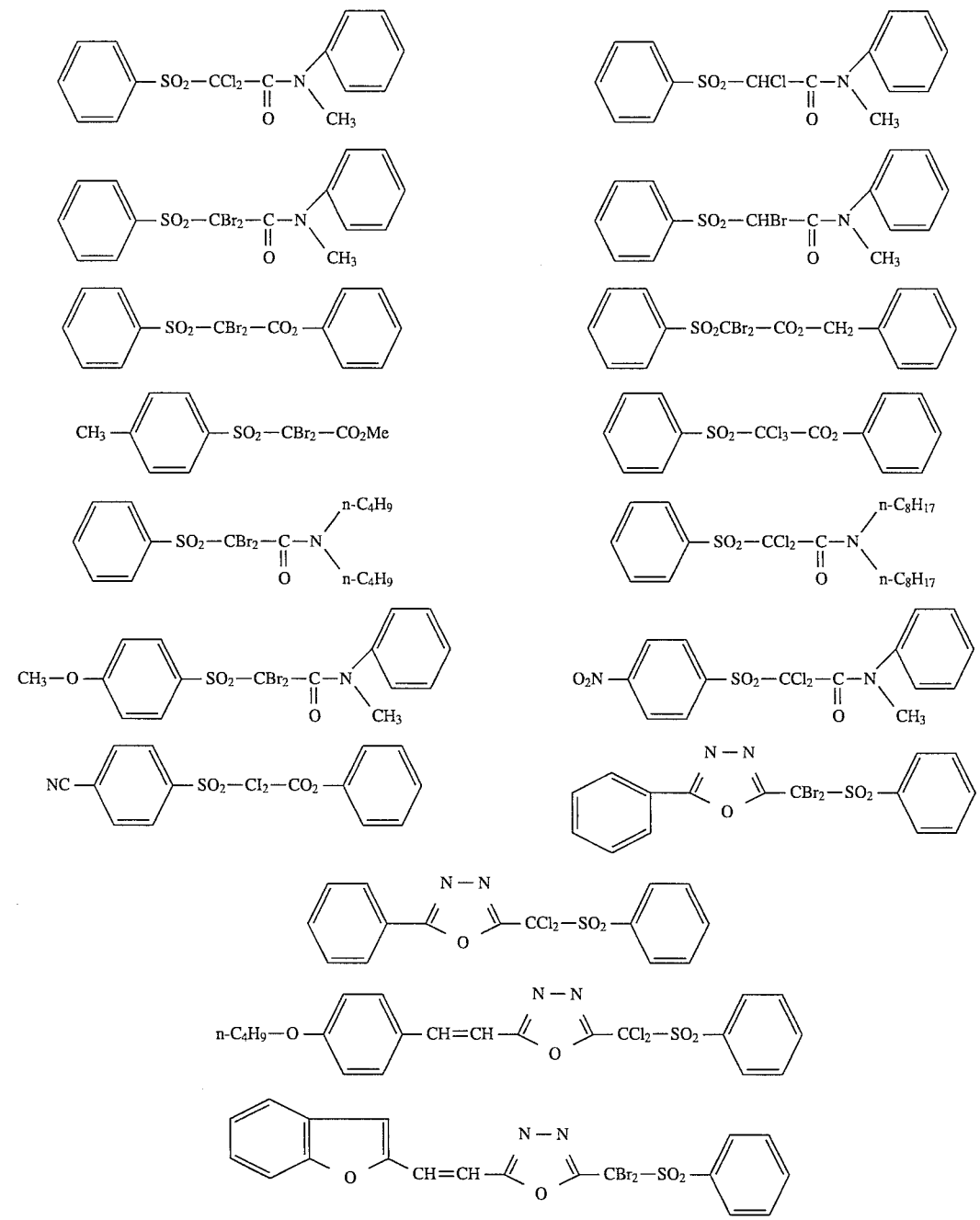
Compounds described in German Patent No. 2,641,100 such as 4-(4-methoxystyryl)-6-(3,3,3-trichloropropenyl)-2-pyrone and 4-(3,4,5-trimethoxystyryl)-6-trichloromethyl-2-pyrone;

Compounds described in German Patent No. 3,333,450:

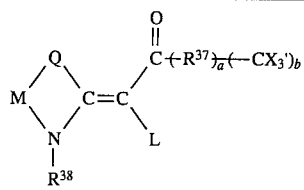

(wherein Q is S and $R^{37}$ is a benzene ring)

| | $R^{38}$ | M | L | a | $(CX_3')_b$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CCl_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |

Compounds described in German Patent No. 3,021,590:

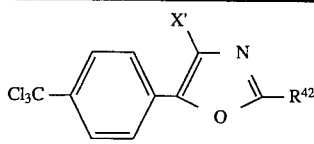

| | $R^{42}$ | X' |
|---|---|---|
| 1 | 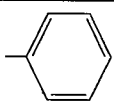 | Cl |
| 2 | 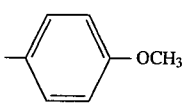 -$OCH_3$ | Cl |
| 3 | -CN | Cl |

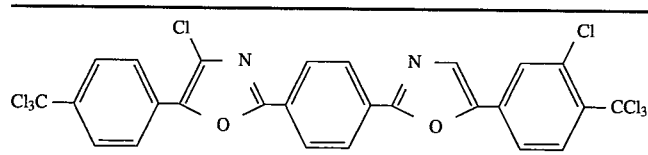

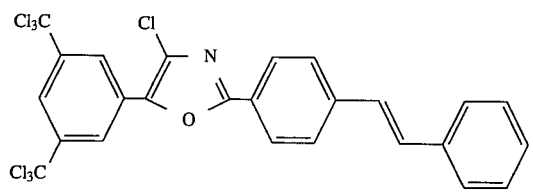

and

Compounds described in German Patent No. 3,021,599:

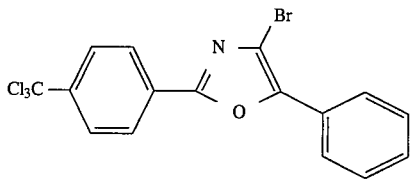

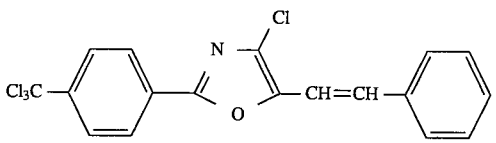

-continued

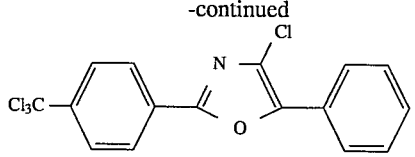

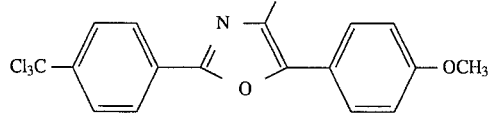

The aromatic onium salt as another example of the component (iii) includes an aromatic onium salt of the elements belonging to Groups 15, 16 and 17 of the Periodic Table, specifically, an aromatic onium salt of N, P, As, Sb, Bi, O, S, Se, Te or I. Examples of the aromatic onium salt include the compounds described in JP-B-52-14277, JP-B-52-14278 and JP-B-52-14279. Specific examples thereof include the following compounds.

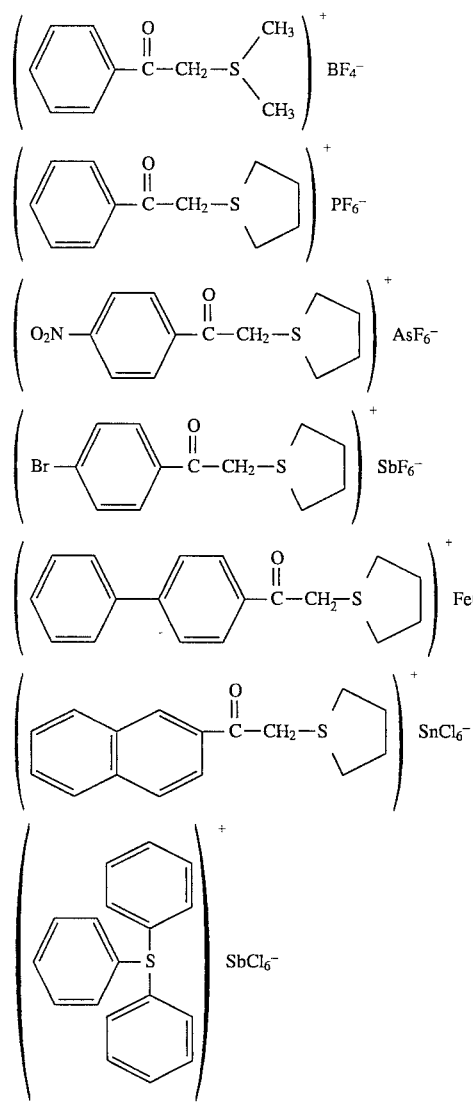

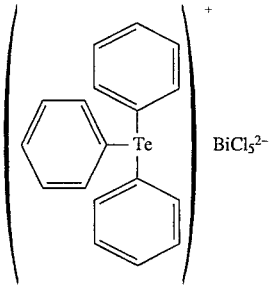

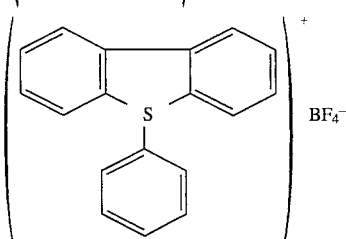

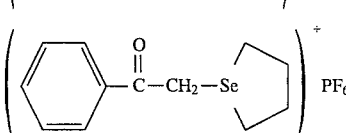

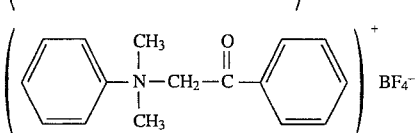

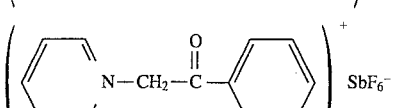

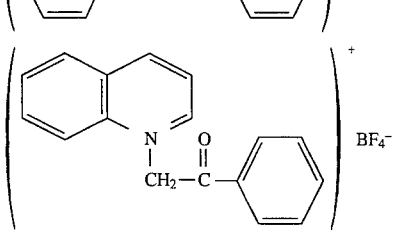

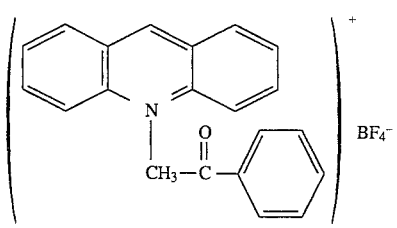

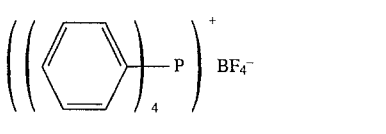

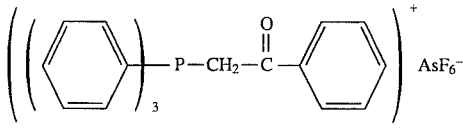

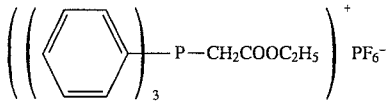

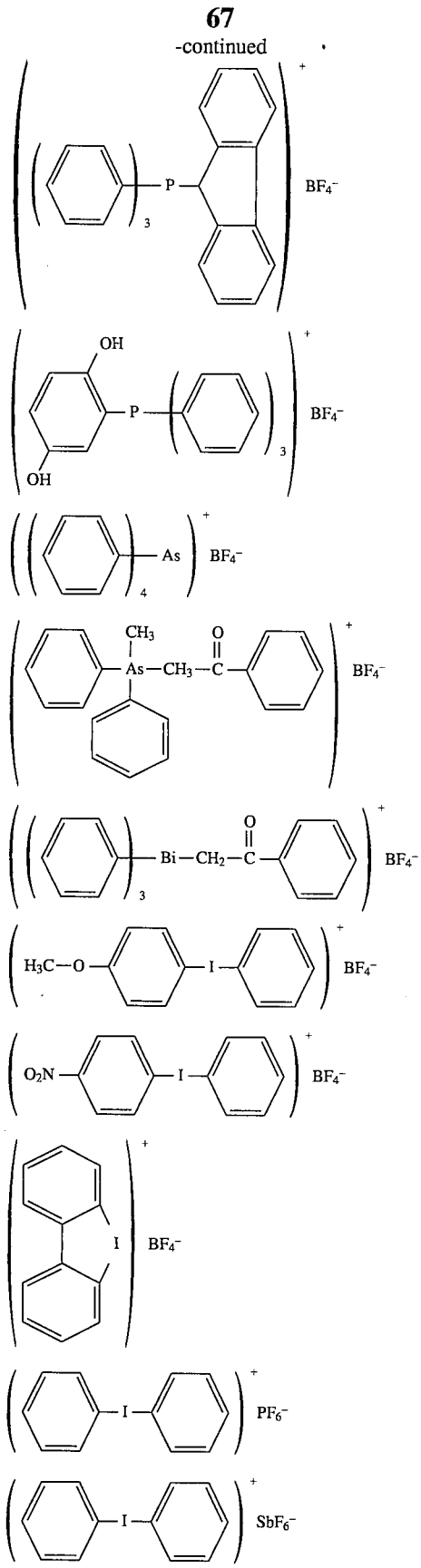

oxygen bonds in the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertial carbonate, 3,3',4,4'-tetra-(t-butylperoxycarbonyl)benzophenone, 3,3',4,4'-tetra-(t-aminoperoxycarbonyl)benzophenone, 3,3',4,4'-tetra-(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyldi(t-butylperoxy dihydrogen diphthalate) and carbonyldi(t-hexylperoxy dihydrogen diphthalate).

Among these, preferred are ester peroxides such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone and di-t-butyl diperoxyisophthalate.

The thio compound as an example of the component (iii) for use in the present invention is represented by formula (IX):

$$\begin{array}{cc} R^{43}-NH & R^{43}-NH \\ | & \| \\ R^{44}-C=S & \text{or} \quad R^{44}-C-SH \end{array} \quad (IX)$$

wherein $R^{43}$ represents an alkyl group, an aryl group or a substituted aryl group, $R^{44}$ represents a hydrogen atom or an alkyl group and also $R^{43}$ and $R^{44}$ each represents a nonmetallic atom group necessary for forming a 5-, 6- or 7-membered ring which may contain a hetero atom selected from an oxygen atom, a sulfur atom and a nitrogen atom, by combining with each other.

The alkyl group represented by $R^{43}$ in formula (IX) is preferably an alkyl group having from 1 to 4 carbon atoms. The aryl group represented by $R^{43}$ is preferably an aryl group having from 6 to 10 carbon atoms such as phenyl and naphthyl and the substituted aryl group includes the above-described aryl group substituted by a halogen atom such as a chlorine atom, an alkyl group such as a methyl group, or by an alkoxy group such as a methoxy group and an ethoxy group. $R^{44}$ is preferably an alkyl group having from 1 to 4 carbon atoms.

Specific examples of the thio compound represented by formula (IX) include the following compounds.

The organic peroxide as still another example of the component (iii) for use in the present invention includes almost all organic compounds having one or more oxygen-

| No. | R⁴³ | R⁴⁴ |
| --- | --- | --- |
| 1 | H | H |
| 2 | H | CH₃ |
| 3 | CH₃ | H |
| 4 | CH₃ | CH₃ |
| 5 | C₆H₅ | C₂H₅ |
| 6 | C₆H₅ | C₄H₉ |
| 7 | C₆H₄Cl | CH₃ |
| 8 | C₆H₄Cl | C₄H₉ |
| 9 | C₆H₄—CH₃ | C₄H₉ |
| 10 | C₆H₄—OCH₃ | CH₃ |
| 11 | C₆H₄—OCH₃ | C₂H₅ |
| 12 | C₆H₄OC₂H₅ | CH₃ |
| 13 | C₆H₄OC₂H₅ | C₂H₅ |
| 14 | C₆H₄OCH₃ | C₄H₉ |
| 15 | (CH₂)₂ | |
| 16 | (CH₂)₂S— | |
| 17 | —CH(CH₃)—CH₂—S— | |
| 18 | —CH₂—CH(CH₃)—S— | |
| 19 | —C(CH₃)₂—CH₃—S— | |
| 20 | —CH₂—C(CH₃)₂—S— | |
| 21 | (CH₂)₂O— | |
| 22 | —CH(CH₃)—CH₂—O— | |
| 23 | —C(CH₃)₂—CH₂—O— | |
| 24 | —CH=CH—N(CH₃)— | |
| 25 | (CH₂)₃S— | |
| 26 | (CH₂)₂CH(CH₃)S— | |
| 27 | (CH₂)₃O— | |
| 28 | (CH₂)₅ | |
| 29 | —C₆H₄—O— | |
| 30 | —N=C(SCH₃)—S— | |
| 31 | —C₆H₄—NH— | |
| 32 | 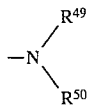 | |

The hexaarylbiimidazole as another example of the component (iii) for use in the present invention includes 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The ketooxime ester as another example of the component (iii) for use in the present invention includes 3-benzoyloxyiminobutane-2-one, 3-acetoxyiminobutane-2-one, 3-propionyloxyiminobutane-2-one, -2acetoxyiminopentane-3-one, 2-acetoxyimino-1-phenylpropane-1-one, 2-benzoyloxyimino-1-phenylpropane-1-one, 3-p-toluenesulfonyloxyiminobutane-2-one and 2-ethoxycarbonyloxyimino-1-phenylpropane-1-one.

The borate salt as still another example of the component (iii) of the present invention includes the compound represented by formula (X):

wherein $R^{45}$, $R^{46}$, $R^{47}$ and $R^{48}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{45}$, $R^{46}$, $R^{47}$ and $R^{48}$ may be combined to form a cyclic structure, provided that at least one of $R^{45}$, $R^{46}$, $R^{47}$ and $R^{48}$ is a substituted or unsubstituted alkyl group, and $Z^+$ represents an alkali metal cation or a quaternary ammonium cation.

The alkyl group represented by $R^{45}$, $R^{46}$, $R^{47}$ or $R^{48}$ includes linear, branched and cyclic alkyl groups each preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes the above-described alkyl group which has a substituent such as halogen atom (e.g., —Cl, Br), a cyano group, a nitro group, an aryl group (preferably a phenyl group), a hydroxy group, $$-N\begin{matrix}R^{49}\\R^{50}\end{matrix}$$

(wherein $R^{49}$ and $R^{50}$ each independently represents a hydrogen atom, an alkyl group having from 1 to 14 carbon atoms or an aryl group), —COOR⁵¹ (wherein $R^{51}$ represents a hydrogen atom, an alkyl group having from 1 to 14 carbon atoms or an aryl group), —OCOR⁵³ or —OR⁵³ (wherein $R^{53}$ represents an alkyl group having from 1 to 14 carbon atoms or an aryl group).

The aryl group represented by $R^{45}$, $R^{46}$, $R^{47}$ or $R^{48}$ includes a mono-, di- or tricyclic aryl group such as a phenyl group and a naphthyl group and the substituted aryl group includes the above-described aryl group which has a substituent described above for the substituted alkyl group or an alkyl group having from 1 to 14 carbon atoms.

The alkenyl group represented by $R^{45}$, $R^{46}$, $R^{47}$ or $R^{48}$ includes linear, branched and cyclic alkenyl groups each having from 2 to 18 carbon atoms and the substituent for the substituted alkenyl group includes the substituents described above for the substituted alkyl group.

The alkynyl group represented by $R^{45}$, $R^{46}$, $R^{47}$ or $R^{48}$ includes linear and branched alkynyl group each having from 2 to 28 carbon atoms and the substituent of the substituted alkynyl group includes the substituents described above for the substituted alkyl group.

The heterocyclic group represented by $R^{45}$, $R^{46}$, $R^{47}$ or $R^{48}$ includes 5- and greater membered, preferably 5- to 7-membered heterocyclic groups each containing at least one of N, S and O and the heterocyclic-group may contain a condensed ring and further may have a substituent described above for the substituted aryl group.

Specific examples of the compound represented by formula (X) include the compounds described in U.S. Pat. Nos. 3,567,453 and 4,343,891 and European Patent Nos. 109,772 and 109,773 and the compounds described below.

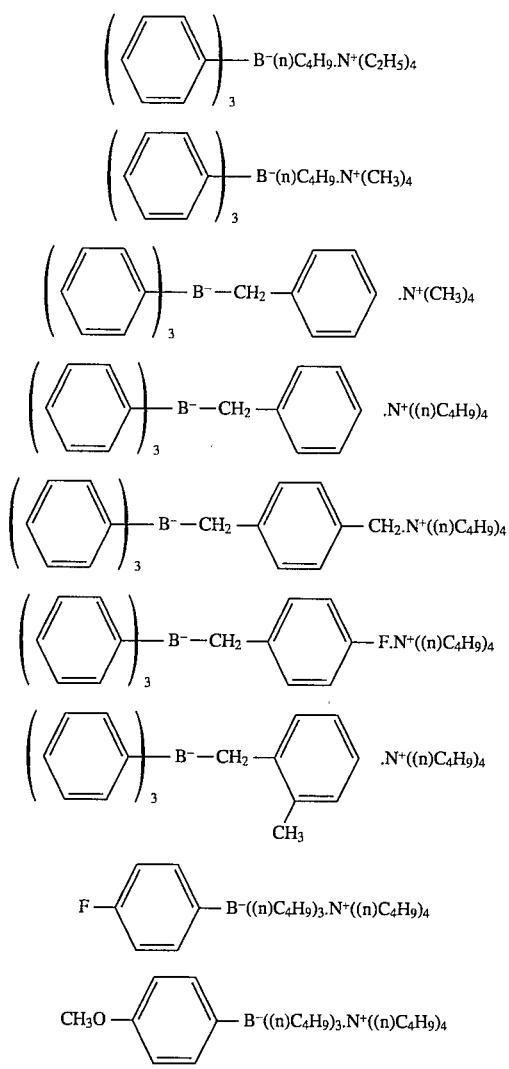

Examples of the azinium salt compound as another example of the component (iii) of the present invention include the compounds having an N—O bond described U.S. Pat. No. 4,743,528, JP-A-63-138345, JP-A-63-142345, JP-A-63-142346, JP-A-63-143537 and JP-B-46-42363. Specific examples of the azinium salt compound include 1-methoxy-4-phenylpyridinium tetrafluoroborate.

Examples of the metallocene compound as still another example of the component (iii) include various titanocene compounds described in JP-A-59-152396, JP-A-61-151197, JP-A-63-41484, JP-A-2-249, JP-A-2-4705 and JP-A-5-83588, such as dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl. The iron-allene complexes described in JP-A-1-304453 and JP-A-1-152109 are also suitably used.

Examples of the active ester compound as still another example of the component (iii) include the imidosulfonate compounds described in JP-B-62-6223 and the active sulfonates described in JP-B-63-14340 and JP-A-59-174831.

The component (iii) of the present invention is more preferably the above-described compound having a carbon-halogen bond and most preferably the trihalomethyl-S-triazine compound represented by formula (II).

The component (iii) of the present invention can be suitably used solely or in combination of two or more thereof.

The concentration of the photopolymerization initiation system, namely, component (ii) and component (iii), contained in the composition of the present invention is usually low and if it is unduly excessive, disadvantageous results such as cutoff of effective light may be caused.

In the present invention, the amount of the photopolymerization initiation system is from 0 01 to 60% preferably from 1 to 30%, based on the total amount of the photopolymerizable, ethylenically unsaturated compound and the linear organic high molecular polymer which is added if desired.

With respect to the ratio between the component (ii) and the component (iii) as the components in the photopolymerization initiation system used in the present invention, the component (iii) is preferably used in an amount of from 0.01 to 50 parts by weight, more preferably from 0.02 to 20 parts by weight and most preferably from 0.05 to 10 parts by weight, per 1 part by weight of the organic dye as the component (ii).

The photopolymerizable composition of the present invention may further contain a known compound which acts to increase more the sensitivity or prevent the polymerization inhibition due to oxygen, as a co-sensitizer.

One co-sensitizer is an amine and examples thereof include the compounds described in M. R. Sander et al., *Journal of Polymer Society*, Vol. 10, p. 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825. Specific examples thereof include triethanolamine, ethyl p-dimethylaminobenzoate, p-formyldimethylaniline and p-methylthiodimethylaniline.

Another co-sensitizer is a thiol or a sulfide and examples thereof include the thiol compounds described in JP-A-53-705, JP-B-55-500806 and JP-A-5-142772 and the disulfide compounds described in JP-A-56-75643. Specific examples thereof include 2-mercaptobenzothiazole, 2-mercaptobenzoxazole, 2-mercaptobenzimidazole, 2-mercapto-4(3H)-quinazoline and β-mercaptonaphthalene.

Still another co-sensitizer is an amino acid compound (e.g., N-phenylglycine), an organometallic compound described in JP-B-48-42965 (e.g., tributyltin acetate), a hydrogen donor described in JP-B-55-34414, a sulfur compound described in JP-A-6-308727 (e.g. trithian), a phosphorus compound described in JP-A-6-250389 (e.g., diethyl phosphite) and Si—H and Ge—H compounds described in Japanese Patent Application No. 6-191605.

Still another co-sensitizer is an aminoketone compound described in U.S. Pat. No. 4,318,791 and European Patent Application No. 0284561A1 and examples thereof include the following compounds.

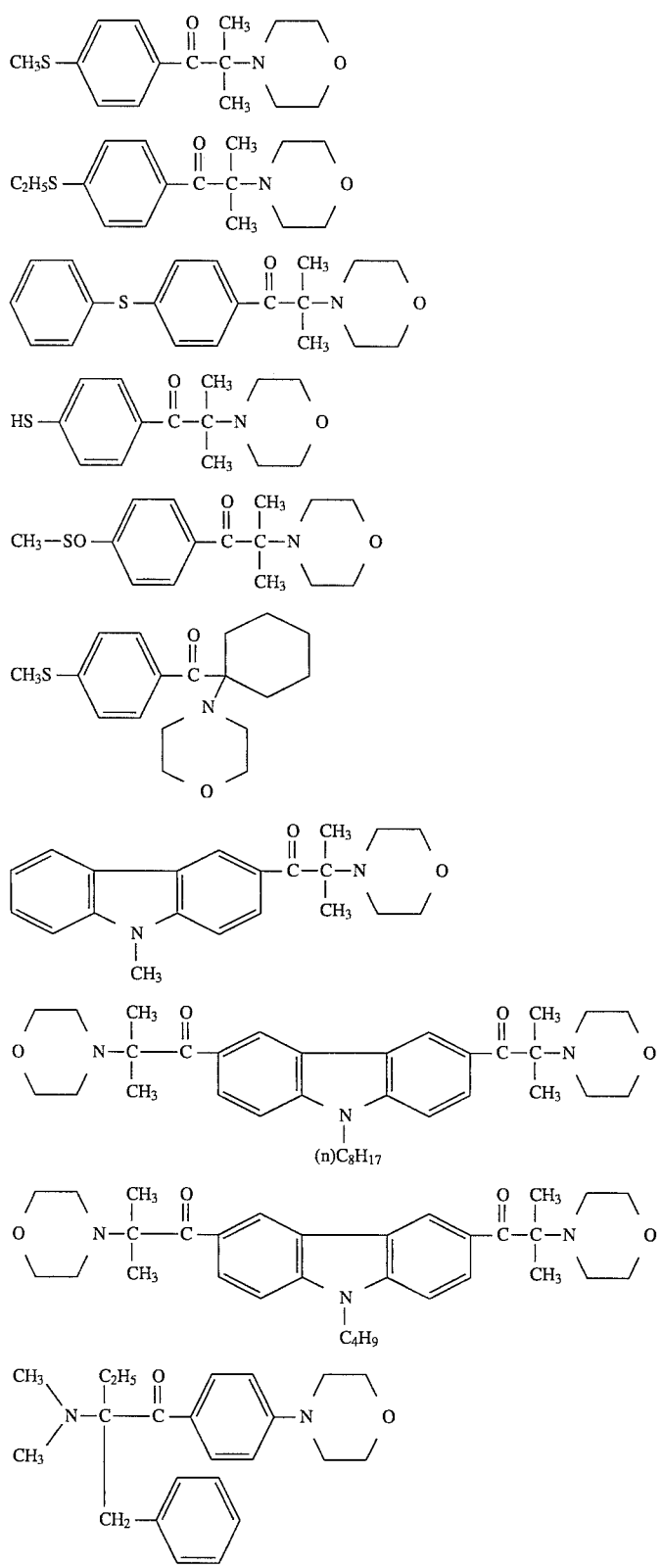
As still another example, oxime ethers described in Japanese Patent Application No. 7-13108 are suitably used. Specific examples thereof include the following compounds.

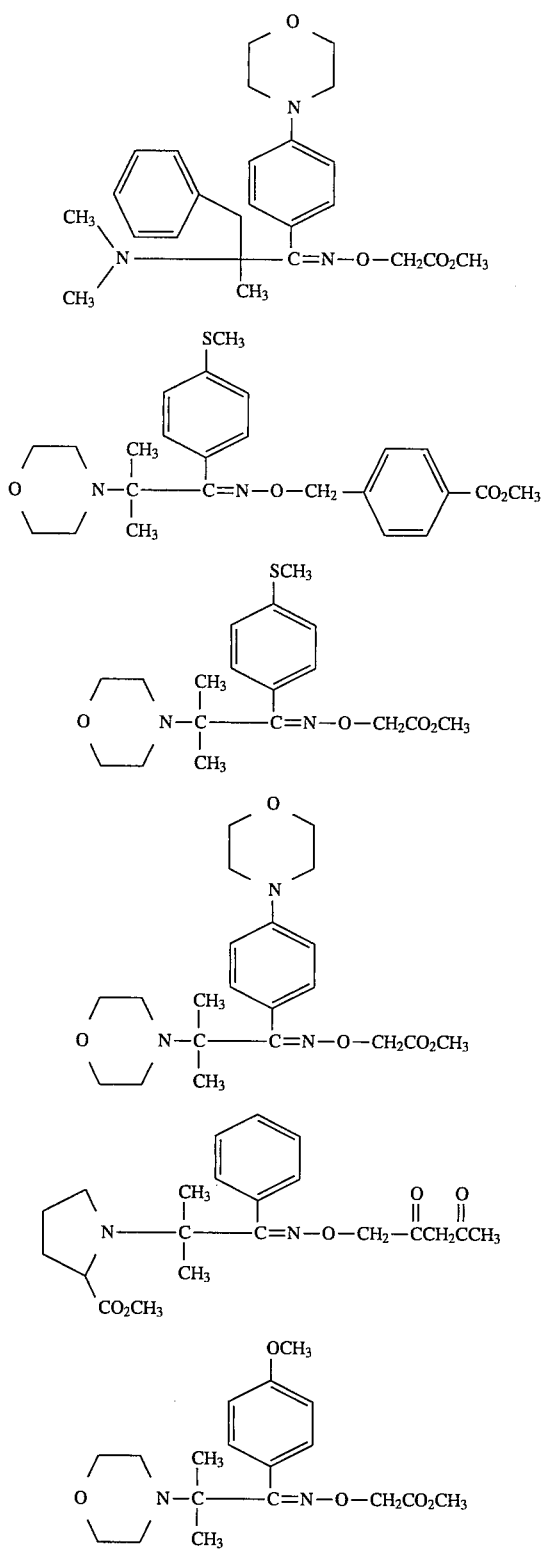

When the above-described co-sensitizer is used, it is preferably used in an amount of from 0.01 to 50 parts by weight, more preferably from 0.02 to 20 parts by weight and most preferably from 0.05 to 10 parts by weight, per 1 part by weight of the compound as component (ii).

The photopolymerizable composition of the present invention preferably contains a linear organic high molecular polymer as a binder. Any linear organic high molecular polymer may be used as long as the linear organic high molecular polymer has compatibility with the photopolymerizable, ethylenically unsaturated compound. A water- or alkalescent water-soluble or swellable linear organic high molecular polymer capable of water development or alkalescent water development is preferably selected. The linear organic high molecular polymer is used not only as the film forming agent of the composition but also as a developer appropriately selected depending on the use of water, alkalescent water or an organic solvent. For example, when a water-soluble organic high molecular polymer is used, water development can be carried out. This kind of a linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group on the side chain may be used. An addition product of a cyclic acid anhydride to the addition polymer having a hydroxyl group may also be useful. Among these, a [benzyl (meth-)acrylate/ (meth)acrylic acid/other addition polymerizable vinyl monomer, if desired] copolymer and an [allyl (meth-)acrylate/(meth)acrylic acid/other addition polymerizable vinyl monomer, if desired] copolymer are preferred. In addition, polyvinyl pyrrolidone and polyethylene oxide are useful as a water-soluble linear organic polymer. Further, an alcohol-soluble polyamide and a polyether of 2,2-bis(4-hydroxyphenyl)propane with epichlorohydrin are also useful so as to increase the strength of the cured film. The above-described linear organic high molecular polymer can be mixed into the entire composition in a freely selected amount. However, if the mixing amount exceeds 90 wt %, disadvantageous results may be caused in view of the strength of an image formed and the like. The mixing amount is preferably from 30 to 85%. The ratio of the photopolymerizable, ethylenically unsaturated compound to the linear organic high molecular polymer is preferably from 1/9 to 7/3 (by weight), more preferably from 3/7 to 5/5.

In addition to the above-described fundamental components, a slight amount of a heat polymerization inhibitor is preferably added in the present invention so as to prevent unnecessary heat polymerization of the polymerizable, ethylenically unsaturated compound during the production or storage of the photosensitive composition. Suitable examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine primary cerium salt and N-nitrosophenylhydroxylamine aluminum salt. The addition amount of the heat polymerization inhibitor is preferably from about 0.01 to about 5% based on the weight of the entire composition. Also, if desired, a higher fatty acid derivative such as a behenic acid and a behenic acid amide may be added to disperse unevenly on the surface of the photosensitive layer during the drying process after coating so as to prevent the polymerization inhibition due to oxygen. The addition amount of the higher fatty acid derivative is preferably from about 0.5 to about 10% of the entire composition.

In the present invention, a dye or a pigment may be added for the purpose of coloring the photosensitive layer. The addition amount of the dye or the pigment is from 0.01 to 20%, preferably from 0.5 to 10% by weight of the entire composition. A pigment is preferred more than a dye.

As the pigment, commercially available pigments and known pigments described in various publications, for example, in *C. I. Binran, "Saishin Gnaryo Binran"*, Nippon Ganryo Gijutsu Kyokai (compiler) (1977), *Saishin Ganryo Oyo Gijutsu*, CMC (1986) and *Insatsu Ink Gijutsu*, CMC (1984), can be used.

Examples of the pigment include a black pigment, a yellow pigment, an orange pigment, a brown pigment, a red pigment, a violet pigment, a blue pigment, a green pigment, a fluorescent pigment, a metal powder pigment and in addition, polymer bonded dyes. Specific examples thereof include an insoluble azo pigment, an azo lake pigment, a condensed azo pigment, a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyeing lake pigment, an azine pigment, a nitroso pigment, a nitro pigment, a natural pigment, a fluorescent pigment and an inorganic pigment. Among these, preferred are an insoluble azo pigment, an azo lake pigment, a phthalocyanine-based pigment and an anthraquinone-based pigment.

The pigment may be dispersed in the presence of a polymer and examples of the polymer include polymers having an aliphatic double bond on the main chain or on the side chain as represented by formulae (x), (y) and (z) of Japanese Patent Application No. 6-193357:

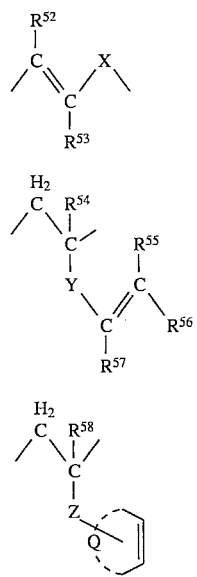

wherein $R^{52}$, $R^{53}$, $R^{54}$, $R^{55}$, $R^{56}$, $R^{57}$ and $R^{58}$ each independently represents a hydrogen atom, an alkyl group or an aryl group, X, Y and Z each independently represents a divalent linking group and Q represents an atomic group necessary for forming an aliphatic ring.

The alkyl group includes an alkyl group preferably having 20 or less, more preferably from 10 or less, and still more preferably 6 or less carbon atoms (e.g., methyl, ethyl, propyl, butyl, hexyl, isopropyl).

The aryl group includes an aryl group having from 6 to 22 carbon atoms (e.g., phenyl, naphthyl, anthryl).

The alkyl group or the aryl group may be substituted by a substituent such as an alkoxy group, an amido group or an alkoxycarbonyl group.

$R^1$, $R^2$, $R^3$, $R^4$, $R^5$, $R^6$ and $R^7$ each is preferably a hydrogen atom or an alkyl group, more preferably a hydrogen atom or methyl.

Examples of the divalent linking group represented by X or Y include an alkylene group, an arylene group, a carbonyl group, an imino group, an oxygen atom, a sulfur atom or a combination of these. The divalent linking group may be substituted by an aryl group, a halogen atom, a hydroxyl group or a cyano group.

The alkylene group includes an alkylene group having preferably 10 or less, more preferably 6 or less, still more preferably 3 or less carbon atoms (e.g., —CH$_2$CH$_2$CH$_2$—, —CH$_2$CH$_2$—, —CH$_2$CH(CH$_3$)—).

The arylene group includes an arylene group having from 6 to 22 carbon atoms (e.g.,

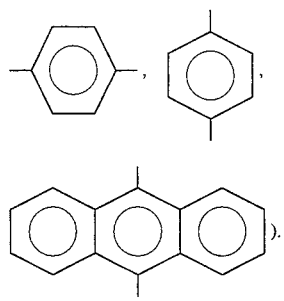

X is preferably an alkylene group. Y is preferably an alkylene group, a carbonyl group, an oxygen atom or a combination of these.

The aliphatic ring formed by Q is preferably an aliphatic ring having from 5 to 30 carbon atoms as a combination of 5- or 6-membered rings (e.g., cyclohexane ring, norbornenyl ring, dicyclopentadiene ring). The aliphatic ring includes bicyclic or tricyclic hydrocarbon having a bridge head carbon atom. The carbon-carbon double bond present in the aliphatic ring is preferably one.

The photopolymerizable composition of the present invention may contain an inorganic filler or other known additives for improving the physical properties of the cured film.

Further, a surface active agent is preferably added so as to improve the surface state on coating. As the surface active agent, fluorine-based surface active agents are preferred.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %. The coverage thereof is in terms of the weight after drying preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc or copper, a plastic film such as cellulose diacetate, cellulose triacetate, cellulose propionate, cellulose lactate, cellulose acetate lactate, cellulose nitrate, polyethylene terephthalate, polyethylene, polystyrene, polypropylene, polycarbonate or polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film described in JP-B-48-18327 may be preferably used.

A support having a metal, particularly an aluminum surface is preferably subjected to surface treatment such as graining treatment, dipping treatment in an aqueous solution of sodium silicate, potassium fluorozirconate or phosphate, or anodic oxidation treatment.

The graining treatment is preferably conducted by brush graining or electrolysis graining. In the case of electrolysis graining, the electrolyte is preferably an aqueous solution of nitric acid or hydrochloric acid, more preferably an aqueous solution of nitric acid.

Further, an aluminum plate subjected to graining and then to dipping treatment in an aqueous solution of sodium silicate may be preferably used. An aluminum plate subjected to anodic oxidation treatment and then to dipping treatment in an aqueous solution of alkali metal silicate described in JP-B-47-5125 may be also suitably used.

The anodic oxidation treatment is carried out by applying current to the aluminum plate as an anode in an electrolyte, for example, in an aqueous or non-aqueous solution of an inorganic acid such as phosphoric acid, chromic acid, sulfuric acid or boric acid or of an organic acid such as oxalic acid or sulfamic acid, which solutions may be used individually or in combination of two or more thereof.

The silicate electrodeposition described in U.S. Pat. No. 3,658,662 is also effective.

Further, the surface treatment comprising a combination of electrolysis graining with the above-described anodic oxidation treatment and sodium silicate treatment disclosed in JP-B-46-27481, JP-A-52-58602 and JP-A-52-30503 is also useful. In this case, the sodium silicate treatment may be omitted.

Furthermore, a support is also suitably subjected to mechanical graining, chemical etching, electrolysis graining, anodic oxidation treatment and sodium silicate treatment successively as disclosed in JP-A-56-28893.

Still further, a support is suitably subjected, after the above-described treatments, to undercoating by a water-soluble resin such as a polymer or copolymer having a polyvinyl phosphonic acid or a sulfonic acid on the side chain or a polyacrylic acid, a water-soluble metal salt (e.g., zinc borate), a yellow dye or an amine salt.

The above-described treatment to achieve hydrophilicity is effected not only to render the support surface hydrophilic but also to prevent harmful reaction of the photopolymerizable composition to be coated thereon and to improve the adhesion to the photosensitive layer.

Further, the back surface of the support is preferably subjected to backcoating described in JP-A-5-2271 and JP-A-6-35174 so as to prevent the elution of aluminum into the developer.

In order to prevent polymerization inhibition action of the oxygen in air, a protective layer comprising a polymer having a low oxygen permeation rate, such as polyvinyl alcohol, in particular, polyvinyl alcohol having a saponification degree of 95% or more, or an acidic cellulose, may be provided on the photopolymerizable composition layer on the support. The coating method of the protective layer is described in detail, for example, in U.S. Pat. No. 3,458,311 and JP-A-55-49729. The coating amount thereof is preferably from 0.1 to 5.0 g, more preferably from 0.5 to 3 g .

The photopolymerizable composition of the present invention can be used for usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, it can provide good effects when it is applied to a photosensitive material for a visible light laser such as an $Ar^+$ laser or a YAG-SHG laser.

Further, the photopolymerizable composition of the present invention is highly sensitive and has sensitivity to visible light and therefore, it can be advantageously used particularly for an image formation system using a microcapsule.

The application to the image formation system using a microcapsule is described, for example, in JP-A-57-197538, JP-A-61-130945, JP-A-58-88739, JP-A-58-88740 and European Patent Application No. 223,587A1. This image formation method comprises coating a microcapsule containing, for example, a photopolymerization initiator composition consisting of an ethylenic vinyl compound and a photopolymerization initiator and a dye precursor on a support, imagewise exposing the resulting photosensitive sheet to cure microcapsules on the exposed area, superposing a developer sheet thereon and applying pressure throughout the sheet to rapture the microcapsules on the unexposed area, whereby a dye image-forming material (e.g., a dye precursor) is transferred to an image-receiving element (e.g., developer layer) to form colors thereon.

The photosensitive material using the photopolymerizable composition of the present invention may be heated after the imagewise exposure. The heating temperature is preferably from 60° to 160° C., more preferably from 80° to 130° C. The heating time is preferably from 1 second to 5 minutes.

The unexposed area of the photosensitive layer is removed by a developer to obtain an image. In using the photopolymerizable composition for producing a lithographic printing plate, the developer described in JP-B-57-7427 is preferred and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or of an organic alkali agent such as monoethanolamine or diethanolamine is suitably used. The alkali agent is added to give a concentration of from 0 1 to 10 wt % preferably from 0.5 to 5 wt %.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,171 and 3,615,480. Further, the developers described in JP-A-50-26601, JP-A-58-54341, JP-B-56-39464 and JP-B-56-42860 are also excellent.

However, the use of the organic solvent involves a hygienic problem such as toxicity and odor at the operation site, a safety problem such as firing, a problem in view of operationability such as generation of bubbles, or a problem such as environmental pollution due to the waste water and accordingly, the developer preferably contains substantially no organic solvent. The aqueous alkali developer substantially free of an organic solvent includes the developer composition described, for example, in JP-A-59-84241 and JP-A-57-192952.

A commercially available developer which can be suitably used is a solution obtained by diluting DP-4 (produced by Fuji Photo Film Co., Ltd.) with water to from 1/6 to 1/30.

The photosensitive lithographic printing plate using a photopolymerizable composition of the present invention may be subjected to such treatment after development as described in JP-A-54-8002, JP-A-55-115045 and JP-A-59-58431, more specifically, desensitizing treatment through or without water washing, treatment with an aqueous solution containing an acid or desensitizing treatment after treatment with an aqueous solution containing an acid. In the development process of this kind of photosensitive lithographic printing plate, the aqueous alkali solution is consumed according to the processed amount to cause reduction in the alkali concentration or the alkali concentration is reduced due to air in a long-time operation in an automatic developing machine and as a result, the processing capacity is lowered. In this case, the processing capacity can be recovered by the replenisher and the replenishing method described in JP-A-54-62004, JP-A-55-22759, JP-A-55-115039, JP-A-56-12645, JP-A-58-95349, JP-A-64-21451, JP-A-1-180548 and JP-A-2-3065.

The above-described print-making process is preferably carried out in an automatic developing machine described in JP-A-2-7054 and JP-A-2-32357. As the desensitizing gum to be coated, if desired, at the final step of the print-making process, those described in JP-B-62-16834, JP-B-62-25118, JP-B-63-52600, JP-A-62-7595, JP-A-62-11693 and JP-A-62-83194 are preferably used.

After the development, the printing plate may be subjected to burning heat treatment or post exposure to improve the impression capacity at printing.

The photopolymerizable composition of the present invention exhibits high sensitivity to active light over a wide region from ultraviolet light to visible light. Accordingly, an ultrahigh-pressure mercury lamp, a high-pressure mercury lamp, a medium-pressure mercury lamp or a low-pressure mercury lamp, a chemical lamp, a carbon arc lamp, a xenon lamp, a metal halide lamp, a visible laser lamp, an ultraviolet laser lamp, a fluorescent lamp, a tungsten lamp or sunlight can be used as a light source.

The present invention will be described below in greater detail by referring to the examples, but the present invention should not be construed as being limited to these examples.

EXAMPLES 1 TO 9 AND COMPARATIVE EXAMPLES 1 TO 3

A 0.3 mm-thick aluminum plate was dipped in a 10% sodium hydroxide at 60° C. for 25 seconds to effect etching, washed with flowing water, neutralization-washed with a 20% nitric acid and then washed with water. The resulting plate was subjected to electrolysis graining treatment using a sine waveform alternating current in a 1% aqueous nitric acid solution at an anode electricity quantity of 300 coulomb/dm². Subsequently, the plate was dipped in an aqueous solution of a 1% sodium hydroxide at 40° C. for 5 seconds and then dipped in an aqueous solution of a 30% sulfuric acid solution to effect desmutting at 60° C. for 40 seconds. Thereafter, the plate was subjected to anodic oxidation treatment in an aqueous solution of a 20% sulfuric acid at a current density of 2 A/dm² for 2 minutes to give an anodic oxidation film thickness of 2.7 g/m². The surface roughness measured was 0.3 µ(Ra indication).

The following sol-gel reaction solution was coated on the back surface of the thus-treated substrate by a bar coater and dried at 80° C. for 1 minute to prepare Support A with a backcoat layer having a coated amount of 70 mg/m² after drying.

Preparation of Sol-Gel Reaction Solution

| Tetraethyl silicate | 50 parts by weight |
| Water | 20 parts by weight |
| Methanol | 15 parts by weight |
| Phosphoric acid | 0.05 part by weight |

The above-described components were mixed and stirred and then heat generation started in about 5 minutes. After allowing them to react for 60 minutes, the following solution was added thereto to prepare a coating solution for a backcoat layer.

| Pyrogallol formaldehyde condensed resin (M.W. 2,000) | 4 parts by weight |
| Dimethyl phthalate | 5 parts by weight |
| Flourine-based surface active agent (N-butyl perfluoro-octane sulfonamidoethyl-acrylate/polyoxyethylene acrylate copolymer, molecular weight: 20,000) | 0.7 part by weight |
| Methanol silica sol (produced by Nissan Chemical KK, methanol: 30%) | 50 parts by weight |
| Methanol | 800 parts by weight |

The photosensitive composition having the following composition was coated on the surface of the aluminum plate treated as above to give a dry coated weight of 1.4 g/m² and then dried at 80° C. for 2 minutes to form a photosensitive layer.

| Pentaerythritol tetraacrylate | 2.0 g |
| Allyl methacrylate/methacrylic acid copolymer (copolymerization molar ratio: 80/20) | 2.0 g |
| Component (ii) | X g |
| Component (iii) | Y g |
| Fluorine-based nonionic surface active agent (F-177, produced by Dai-Nippon Ink & Chemicals, Inc.) | 0.03 g |
| Heat polymerization inhibitor: N-nitroso-phenylhydroxylamine aluminum salt | 0.01 g |
| Pigment Dispersion Composition: | 2.0 g |
| P.B. 15:6 | 30 parts |
| Allyl methacrylate/methacrylic acid copolymer (copolymerization molar ratio: 83/17) | 20 parts |
| Cyclohexanone | 35 parts |
| Methoxypropylacetate | 35 parts |
| Propylene glycol monomethyl ether | 80 parts |
| Methyl ethyl ketone | 20 g |
| Propylene glycol monomethyl ether | 20 g |

The component (ii) and the component (iii) are described in Table A below.

On the thus-provided photosensitive layer, a 3 wt % aqueous solution of polyvinyl alcohol (saponification degree: 98 mol %, polymerization degree: 1,000) was coated to give a dry coated weight of 2 g/m² and dried at 100° C. for 2 minutes to form a protective layer.

FUJI PS Step Guide (a gray scale having ΔD=0.15 and discontinuously changed in the transmission density, manufactured by Fuji Photo Film Co., Ltd.) was put into close contact with the photosensitive material obtained above and exposed to light entering from above.

The light source used was a xenon lamp and light was irradiated through Kenko Optical Filter BP-49. The energy on the PS Step Guide surface was 0.25 mJ/cm².

The exposed photosensitive material was heated at 120° C. for 20 seconds and then developed. The sensitivity was shown by a clear stage number after development of the PS Step Guide. The larger the stage number, the higher the sensitivity. The development was conducted by dipping the photosensitive material in the following developer at 25° C. for 10 seconds.

| | |
|---|---|
| DP-4 (produced by Fuji Photo Film Co., Ltd.) | 66.5 g |
| Water | 881.4 g |
| Lipomin (20% aq. soln.) | 52.1 g |

To test the storage stability, the photosensitive material produced above was naturally aged for one month and the presence or the absence of deposits from the photosensitive material was observed through an optical microscope. Also, deposits under the storage condition of 50° C. in an oven were traced.

-continued
Compounds in the Table

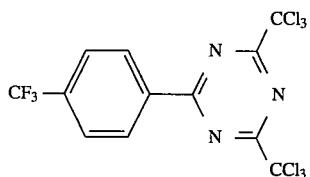
(B)

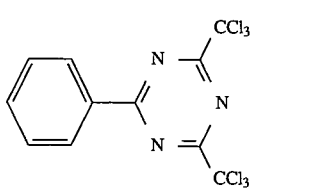
(C)

The component (ii) of the present invention was excellent in the sensitivity to visible light as compared with the comparative compound. Further, by using the component (ii), the deposition from the photosensitive material during storage was apparently inhibited as compared with the case where a comparative compound was used. In other words, it is apparent that the photopolymerizable composition containing the component (ii) is superior in the sensitivity and the storage stability.

EXAMPLES 10 TO 22 AND COMPARATIVE EXAMPLES 4 TO 9

The photosensitive composition having the following composition was coated on the surface of the aluminum

TABLE A

| | Photopolymerization Initiator | | | | Sensitivity to Light through BP-49 Filter (stage number of step wedge) | Deposit from Photosensitive Layer | |
|---|---|---|---|---|---|---|---|
| | Component (ii) | X g | Component (iii) | Y g | | After One-month Natural Aging | Storage at 50° C. in Oven |
| Example 1 | (IA-4) | 0.12 | (B) | 0.054 | 7 | no deposit was observed | no deposit was observed after one week |
| Example 2 | (IA-5) | 0.13 | (B) | 0.054 | 7 | | |
| Example 3 | (IA-7) | 0.11 | (B) | 0.054 | 6.5 | | |
| Example 4 | (IA-10) | 0.14 | (B) | 0.054 | 7 | | |
| Example 5 | (IA-26) | 0.14 | (B) | 0.054 | 7.5 | | |
| Example 6 | (IA-43) | 0.14 | (B) | 0.054 | 7 | | |
| Example 7 | (IA-4) | 0.12 | (C) | 0.051 | 6.5 | | |
| Example 8 | (IA-4) | 0.24 | (B) | 0.054 | 7.5 | | |
| Example 9 | (IA-4) | 0.36 | (B) | 0.054 | 7.5 | | |
| Comparative Example 1 | (A) | 0.12 | (B) | 0.054 | 6 | deposits were observed | deposits were generated after three days |
| Comparative Example 2 | (A) | 0.12 | (C) | 0.051 | 5.5 | | |
| Comparative Example 3 | (A) | 0.24 | (B) | 0.054 | 6 | a great amount of deposits were observed | deposits were generated in one day |

Compounds in the Table

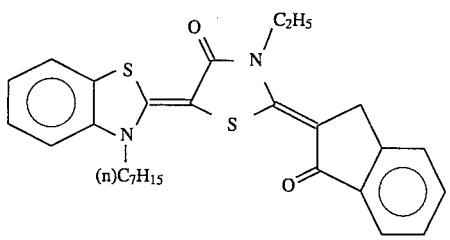
(A)

plate of Support A prepared in the same manner as in Example 1 to give a dry coated weight of 1.5 g/m² and then dried at 80° C. for 2 minutes to form a photosensitive layer.

| | |
|---|---|
| Pentaerythritol tetraacrylate | 2.0 g |
| Allyl methacrylate/methacrylic acid copolymer (copolymerization molar ratio: 80/20) | 2.0 g |
| Component (ii) | X g |
| Component (iii) | Y g |
| Co-Sensitizer (S) | Z g |
| Fluorine-based nonionic surface active | 0.03 g |

| | |
|---|---|
| agent (F-177, produced by Dai-Nippon Ink & Chemicals, Inc.) | |
| Heat polymerization inhibitor: N-nitroso-phenylhydroxylamine aluminum salt | 0.01 g |
| Pigment Dispersion | 2.0 g |
| Composition: | |
| P.B. 15:6 (copper phthalocyanaine) | 30 parts |
| Allyl methacrylate/methacrylic acid copolymer (copolymerization molar ratio: 83/17) | 20 parts |
| Cyclohexanone | 35 parts |
| Methoxypropylacetate | 35 parts |
| Propylene glycol monomethyl ether | 80 parts |
| Methyl ethyl ketone | 20 g |
| Propylene glycol monomethyl ether | 20 g | shown by a clear stage number after development of the PS Step Guide. The larger the stage number, the higher the sensitivity. The development was conducted by dipping the photosensitive material in the following developer at 25° C. for 10 seconds.

| | |
|---|---|
| DP-4 (produced by Fuji Photo Film Co., Ltd.) | 65.0 g |
| Water | 880.0 g |
| Lipomin LA (20% aq. soln.) | 50.0 g |

TABLE B

| | Photopolymerization Initiator | | | | | | Sensitivity to Light through BP-53 Filter (stage number of |
|---|---|---|---|---|---|---|---|
| | Component (ii) | X g | Component (iii) | Y g | Co-sensitizer S | Z g | step wedge) |
| Example 10 | IB-1 | 0.10 | (B) | 0.10 | | | 2.5 |
| Example 11 | IB-2 | 0.11 | (B) | 0.10 | | | 2.5 |
| Example 12 | IB-18 | 0.12 | (B) | 0.10 | | | 2.5 |
| Example 13 | IB-26 | 0.13 | (B) | 0.10 | | | 3.0 |
| Example 14 | IB-35 | 0.13 | (B) | 0.10 | | | 3.0 |
| Example 15 | IB-1 | 0.10 | (B) | 0.10 | (E) | 0.20 | 3.5 |
| Example 16 | IB-1 | 0.10 | (B) | 0.10 | (F) | 0.20 | 4.0 |
| Example 17 | IB-18 | 0.12 | (D) | 0.10 | (E) | 0.20 | 4.0 |
| Example 18 | IB-26 | 0.13 | (D) | 0.10 | (F) | 0.20 | 4.5 |
| Comparative Example 4 | (A) | 0.12 | (B) | 0.10 | | | 0.5 |
| Comparative Example 5 | (A) | 0.12 | (B) | 0.10 | (E) | 0.20 | 1.0 |
| Comparative Example 6 | (A) | 0.12 | (D) | | | | 0.5 |
| Comparative Example 7 | (A) | 0.12 | (D) | 0.10 | (F) | 0.20 | 1.0 |

The component (ii), the component (iii) and the co-sensitizer (S) are described in Table B below.

On the thus-provided photosensitive layer, a 3 wt % aqueous solution of polyvinyl alcohol (saponification degree: 98 mol %, polymerization degree: 1,000) was coated to give a dry coated weight of 2 g/m² and dried at 100° C. for 2 minutes to form a protective layer.

FUJI PS Step Guide (a gray scale having ΔD=0.15 and discontinuously changed in the transmission density, manufactured by Fuji Photo Film Co., Ltd.) was put into close contact with the photosensitive material obtained above and exposed to light entering from above.

The light source used was a xenon lamp and light was irradiated through Kenko Optical Filter BP-53. The energy on the PS Step Guide surface was 0.25 mJ/cm².

The exposed photosensitive material was heated at 120° C. for 20 seconds and then developed. The sensitivity was A photosensitive material comprising the photosensitive layer having the following composition was prepared in the same manner and examined on the sensitivity using BP-51 Filter.

| | |
|---|---|
| Pentaerythritol tetraacrylate | 2.4 g |
| Allyl methacrylate/methacrylic acid copolymer (copolymerization molar ratio: 75/25) | 2.0 g |
| Component (ii) | X g |
| Component (iii) | Y g |
| Co-sensitizer (S) | Z g |
| Flourine-based nonionic surface active agent (F-177, produced by Dai-Nippon Ink & Chemicals, Inc.) | 0.03 g |
| Heat polymerization inhibitor: N-nitroso-phenylhydroxylamine aluminum salt | 0.01 g |
| Pigment Dispersion | 2.0 g |

87
-continued

Composition:

| | |
|---|---|
| P.B. 15:6 (copper phthalocyanine) | 30 parts |
| Allyl methacrylate/methacrylic acid copolymer (copolymerization molar ratio: 83/17) | 20 parts |
| Cyclohexanone | 35 parts |
| Methoxypropylacetate | 35 parts |
| Propylene glycol monomethyl ether | 80 parts |
| Methyl ethyl ketone | 20 g |
| Propylene glycol monomethyl ether | 20 g |

The component (ii), the component (iii) and the co-sensitizer (S) are described in Table C below.

88
-continued

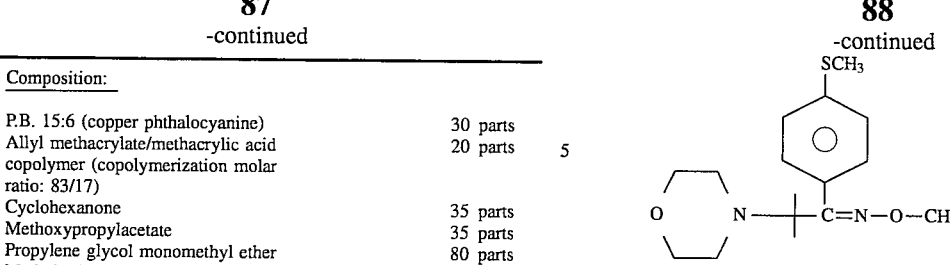

It is apparent that the component (ii) of the present invention is superior to the comparative compounds in the sensitivity to visible light having a wavelength longer than 500 nm.

TABLE C

| | Photopolymerization Initiator | | | | | Sensitivity to Light through BP-51 Filter (stage number of step wedge) |
|---|---|---|---|---|---|---|
| | Component (ii) | X g | Component (iii) | Y g | Co-sensitizer S | Z g | |
| Example 19 | IB-15 | 0.10 | (B) | 0.14 | | | 3.5 |
| Example 20 | IB-16 | 0.11 | (B) | 0.14 | (F) | 0.20 | 4.5 |
| Example 21 | IB-32 | 0.13 | (B) | 0.14 | | | 3.0 |
| Example 22 | IB-34 | 0.13 | (B) | 0.14 | (E) | 0.20 | 4.0 |
| Comparative Example 8 | (A) | 0.10 | (B) | 0.14 | | | 2.0 |
| Comparative Example 9 | (A) | 0.10 | (B) | 0.14 | (E) | 0.20 | 3.0 |

(Compounds in Tables B and C)

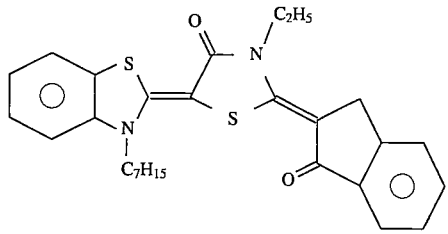
(A)

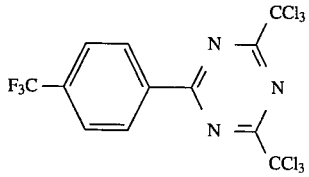
(B)

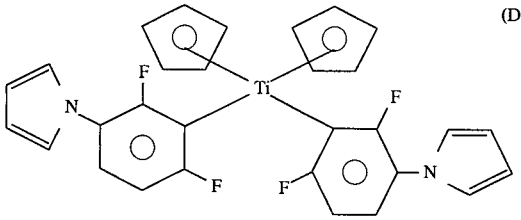
(D)

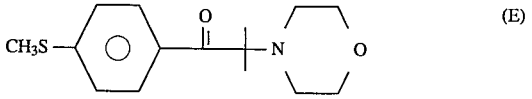
(E)

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising the following components (i), (ii) and (iii):

(i) a compound having at least one addition-polymerizable, ethylenically unsaturated bond;

(ii) a compound represented by formula (IA) or (IB):

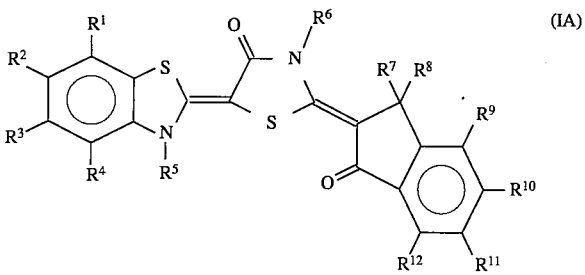

wherein $R^1$, $R^2$, $R^3$, $R^4$, $R^9$, $R^{10}$, $R^{11}$ and $R^{12}$ each independently represents a hydrogen atom, a halogen atom, an alkyl group, a substituted alkyl group, an aryl group, a substituted aryl group, a hydroxyl group, a substituted oxy group represented by $R^{14}O-$ wherein $R^{14}$ is a monovalent nonmetallic atom group exclusive of hydrogen, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group or $R^1$ and $R^2$, $R^2$ and $R^3$, $R^3$ and $R^4$, $R^9$ and $R^{10}$, $R^{10}$ and $R^{11}$, $R^{11}$ and $R^{12}$ are combined with each other to form an aliphatic or aromatic ring; $R^5$ represents a hydrogen atom, an alkyl group, a substituted alkyl group, an aryl group or a substituted aryl group; $R^6$ represents a substituted or unsubstituted alkenylalkyl group, a substituted or unsubstituted alkynylalkyl group, a substituted or unsubstituted alkenyl group or a substituted or unsubstituted alkynyl group; and $R^7$ and $R^8$ each independently represents a hydrogen atom, a halogen atom, an alkyl group, a substituted alkyl group, an aryl group, a substituted aryl group or a substituted carbonyl group,

(IB)

wherein A= represents a substituted or unsubstituted 2(1H)-pyridylidene group or a substituted or unsubstituted 4(1H)-pyridylidene group; —X— represents —O—, —S—, —NR²'— or —CONR3'—; R¹', R²' and R³' each independently represents a hydrogen atom, an alkyl group, a substituted alkyl group, an aryl group, a substituted aryl group, an alkenyl group, a substituted alkenyl group, an alkynyl group or a substituted alkynyl group; and =E represents a substituted or unsubstituted 1,3-dihydro-1-oxo-2H-indene-2-ylidene; and (iii) a compound which generates an active radical upon light irradiation when in the presence of component (ii).

2. A photopolymerizable composition as claimed in claim 1, further comprising a co-sensitizer.

3. A photopolymerizable composition as claimed in claim 1, wherein said component (i) is selected from compounds having at least one ethylenically unsaturated terminal bond.

4. A photopolymerizable composition as claimed in claim 1, wherein said component (i) is used in an amount of from 5 to 70% by weight based on the total weight of the components.

5. A photopolymerizable composition as claimed in claim 1, wherein said component (iii) is selected from the group consisting of a compound having a carbon halogen bond, an aromatic onium salt compound, an organic peroxide compound, a thio compound, a hexaarylbiimidazole compound, a ketooxime ester compound, a borate compound, an azinium compound, a metallocene compound, and an active ester compound.

6. A photopolymerizable composition as claimed in claim 1, wherein the amount of component (ii) and component (iii) is from 0.01 to 60% by weight based on the total amount of component (i) and a linear organic high molecular polymer which is optionally added to the composition.

7. A photopolymerizable composition as claimed in claim 1, wherein component (iii) is used in an amount of from 0.01 to 50 parts by weight per 1 part by weight of component (ii).

8. The photopolymerizable composition of claim 1 wherein in the compound represented by formula (IA), $R^1$ and $R^2$ are combined to form an aliphatic or aromatic ring.

9. The photopolymerizable composition of claim 1 wherein in the compound represented by formula (IA), $R^2$ and $R^3$ are combined to form an aliphatic or aromatic ring.

10. The photopolymerizable composition of claim 1 wherein in the compound represented by formula (IA), $R^3$ and $R^4$ are combined to form an aliphatic or aromatic ring.

11. The photopolymerizable composition of claim 1 wherein in the compound represented by formula (IA), $R^9$ and $R^{10}$ are combined to form an aliphatic or aromatic ring.

12. The photopolymerizable composition of claim 1 wherein in the compound represented by formula (IA), $R^{10}$ and $R^{11}$ are combined to form an aliphatic or aromatic ring.

13. The photopolymerizable composition of claim 1 wherein in the compound represented by formula (IA), $R^{11}$ and $R^{12}$ are combined to form an aliphatic or aromatic group.

* * * * *